(12) United States Patent
Hammond et al.

(10) Patent No.: US 7,569,159 B2
(45) Date of Patent: Aug. 4, 2009

(54) HOLE INJECTION/TRANSPORT LAYER COMPOSITIONS AND DEVICES

(75) Inventors: Troy D. Hammond, Pittsburgh, PA (US); Shawn P. Williams, Pittsburgh, PA (US); Elena Sheina, Pittsburgh, PA (US); Darin W. Laird, Pittsburgh, PA (US); Christopher Greco, Pittsburgh, PA (US); Brian Woodworth, Pittsburgh, PA (US)

(73) Assignee: Plextronics, Inc., Evanston, IL (US)

( * ) Notice: Subject to any disclaimer, the term of this patent is extended or adjusted under 35 U.S.C. 154(b) by 340 days.

(21) Appl. No.: 11/350,271

(22) Filed: Feb. 9, 2006

(65) Prior Publication Data
US 2006/0175582 A1   Aug. 10, 2006

Related U.S. Application Data

(60) Provisional application No. 60/651,211, filed on Feb. 10, 2005.

(51) Int. Cl.
*H01B 1/00* (2006.01)
*H01L 35/24* (2006.01)
*C08G 75/00* (2006.01)

(52) U.S. Cl. .................... 252/500; 257/40; 528/377
(58) Field of Classification Search .............. 252/500; 257/40; 528/377
See application file for complete search history.

(56) References Cited

U.S. PATENT DOCUMENTS

| | | | |
|---|---|---|---|
| 4,387,187 A | 6/1983 | Newton | |
| 4,415,706 A | 11/1983 | Staas | |
| 4,485,031 A | 11/1984 | Olstowski et al. | |
| 4,898,912 A | 2/1990 | Siol et al. | |
| 4,929,388 A | 5/1990 | Wessling | |
| 4,935,164 A | 6/1990 | Wessling et al. | |
| 4,959,430 A | 9/1990 | Jonas et al. | |
| 4,990,557 A | 2/1991 | Lee | |
| 6,166,172 A | 12/2000 | McCullough et al. | |
| 6,372,154 B1 * | 4/2002 | Li | 252/301.16 |
| 6,403,809 B1 * | 6/2002 | Holmes et al. | 549/41 |
| 6,602,974 B1 | 8/2003 | McCullough et al. | |
| 6,682,175 B2 | 1/2004 | Otsuka et al. | |
| 6,824,706 B2 | 11/2004 | Heeney et al. | |
| 2004/0119049 A1 | 6/2004 | Heeney et al. | |
| 2005/0071969 A1 * | 4/2005 | Sirringhaus et al. | 29/4.51 |

OTHER PUBLICATIONS

U.S. Appl. No. 60/651,211, filed Feb. 10, 2005, Hammond.
U.S. Appl. No. 60/612,640, filed Sep. 24, 2004, Williams et al.
U.S. Appl. No. 11/234,374, filed Sep. 26, 2005, Williams et al.
U.S. Appl. No. 11/234,373, filed Sep. 26, 2005, Williams et al.

(Continued)

*Primary Examiner*—Mark Kopec
*Assistant Examiner*—Jaison P Thomas
(74) *Attorney, Agent, or Firm*—Foley & Lardner LLP

(57) ABSTRACT

Compositions for use in HIL/HTL applications include intrinsically conductive polymer, planarizing agent, and dopant, which are soluble in non-aqueous solvents. Block copolymers of regioregular alkyl/alkoxy- and aryl-substituted polythiophenes can be used. The compositions can be formed into thin films. Excellent efficiency and lifetime stability can be achieved.

33 Claims, 6 Drawing Sheets

Cathode (Ca, Al, or Ba)
Conditioning Layer (LiF)
Electroluminescent Polymer
Hole Injection Layer
Anode (ITO on glass or PET)

OTHER PUBLICATIONS

U.S. Appl. No. 60/628,202, filed Nov. 17, 2004, Williams et al.
U.S. Appl. No. 11/274,918, filed Nov. 16, 2005, Williams et al.
Katz, H. E., et al., "Organic Transistor Semiconductors", *Accounts of Chemical Research*, vol. 34, No. 5, pp. 359-369 (2001).
McCullough, R. D., et al., "Regioregular, Head-to-Tail Coupled Poly(3-alkylthiophene) and its Derivatives," pp. 225-258 (1998).
McCullough, R. D., "The Chemistry of Conducting Polythiophenes," *Adv. Mater.*, 10, No. 2, pp. 93-116 (1998).
Book, K. B., et al., "Hole injedction from an ITO | PEDT anode into the hole transporting layer of an OLED probed by bias induced absorption", S. *Organic Electronics*, vol. 4, 227-232 (2003).
Burroughes, J. H., et al., "Light-emitting diodes based on conjugated polymers", *Nature*, vol. 347, 539-541 (1990).
Chen, S., et al., "Influence of the hole injection layer on the luminescent performance of organic light-emitting diodes", *Appl. Phys. Lett.*, vol. 85, 765 (2004).
De Jong, M. P., et al., "Stability of the interface between indium-tin-oxide and poly(3,4-ethylenedioxythiophene)/poly(styrenesulfonate) in polymer light-emitting diodes", *Appl. Phys. Lett.*, vol. 77, 2255 (2000).
De Kok, M. M., et al., "Modification of PEDOT: PSS as hole injection layer in polymer LEDs", *Phys. Stat. Sol.*, vol. 201, 1342-1359 (2004).
Francois, et al., "Block-copolymers with conjugated segments: Synthesis and structural characterization", *Synth. Met.*, vol. 69, pp. 463-466 (1995).
Friend, R. H., et al., "Polymer LEDs", *Physics World*, vol. 5, pp. 42-46 (1992).
Gong, et al., "High-performance polymer light-emitting diodes fabricated with a polymer hole injection layer", Applied Physics Letters, vol. 83, No. 1, pp. 183-185.
Gontia, I., et al., "Excitation Dynamics in Disubstituted Polyacetylene", T. *Phys. Rev. Lett.*, vol. 82, pp. 4058-4061 (1999).
Schlatmann, A. R., "Indium contamination from the indium-tin-oxide electrode in polymer light emitting diodes", *Appl. Phys. Lett.*, vol. 69, pp. 1764-1766 (1996).
Hebner et al., "Ink-jet priting of doped polymers for organic light emitting devices", Applied Physics Letters, vol. 72, No. 5, pp. 519-521 (1998).
Hempenius, M A., et al., "A Polystyrene-Oligothiophene-Polystyrene Triblock Copolymer", *J. Am. Chem. Soc.*, vol. 120, pp. 2798-2804 (1998).
Jenekhe, S. A., et al., "Self-Assembled Aggregates of Rod-Coil Block Copolymers and Their Solubilization and Encapsulation of Fullerenes", *Science*, vol. 279, pp. 1903-1907 (1988).
Kim, J.-S., et al., "Electroluminescence emission pattern of organic light-emitting diodes: Implications for device efficiency calculations", *J. Appl. Phys.*, vol. 88, pp. 1073-1081 (1998).
Kraft, A., et al., "Electroluminescent Conjugated Polymers—Seeing Polymers in a New Light", Angew. Chem. Int. Ed., vol. 37, pp. 402-428 (1998).
Kugler, T., et al., "Polymer band alignment at the interface with indium tin oxide: consequences for light emitting devices" *Chem. Phys. Lett.*, vol. 310, pp. 391-396 (1999).
Li, W., et al., "Syntheses of Oligophenylenelenevinylenes-Polyisoprene Dilbock Copolymers and Their Microphase Separation", *Macromolecules*, vol. 32, pp. 3034-3044 (1999).
Lowe, R. S., et al., "A Simple Method to Prepare Head-to-Tail Coupled, Regioregular Poly(3-alkylthiophenes) Using Grignard Metathesis", *Adv. Mater.*, vol. 11, pp. 250-253 (1999).
Redecker, M. B., et al., "High Mobility Hole Transport Fluorene-Triarylamine Copolymers", *Adv. Mater.*, vol. 11, pp. 241-246 (1999).
Roncali, J., "Conjugated Poly(thiophenes): Synthesis, Functionalization, and Applications", *Chem. Rev.*, vol. 92, pp. 711-738 (1992).
Sheina, E. E., et al., "Chain Growth Mechanism for Regioregular Nickel-Initiated Cross-Coupling Polymerizations", *Macromolecules*, vol. 37, pp. 3526-3528 (2004).
Shirota, Y. K., et al., "Multilayered organic electroluminescent device using a novel starburst molecule, 4,4',4''-tris(3-methylphenylphenylamino)triphenylamine, as a hole transport material", *Appl. Phys. Lett.*, vol. 65, pp. 807-810 (1994).
Shuai, Z., et al., "Singlet and Triplet Exciton Formation Rates in Conjugated Polymer Light-Emitting Diodes", *Phys. Rev. Lett.*, vol. 84, pp. 131-134 (2000).
*The Encyclopedia of Polymer Science and Engineering*, Wiley, pp. 298-300 (1990).
Wang, H., et al., "Syntheses of Amphiphilic Diblock Copolymers Containing a Conjugated Block and Their Self-Assembling Properties", *J. Am. Chem. Soc.*, vol. 122, pp. 6855-6861 (2000).
Widawski et al., "Self-organized honeycomb morphology of star-polymer polystyrene films", *Nature* (London), vol. 369, 387-389 (1994).
Yang et al., "A Soluble Blue-Light-Emitting Polymer", *Macromolecules*, vol. 26, pp. 1188-1190 (1993).
Yokoyama, A., et al., "Chain-Growth Polymerization for Poly(3-hexylthiophene) with a Defined Molecular Weight and a Low Polydispersity", *Macromolecules*, vol. 37, pp. 1169-1171 (2004).

* cited by examiner

Regioregular poly(3-substituted thiophene)-*b*-poly(styrene)

Regioregular poly(3-substituted thiophene)-*b*-poly(methyl methacrylate)

HOLE INJECTION/TRANSPORT LAYER COMPOSITIONS AND DEVICES

RELATED APPLICATIONS

This application claims priority to U.S. provisional patent application 60/651,211 filed Feb. 10, 2005, which is hereby incorporated by reference in its entirety.

BACKGROUND

This invention relates generally to organic electroluminescent devices, and components thereof, which utilize organic small molecules or polymers that produce light when transferred into their excited state by an external power source. The excited state is created when positive and negative charges flow from opposite electrodes into the electroluminescent materials. Hole injection and/or hole transport materials forming a layer between one electrode and the electroluminescent material can improve the efficiency of the device (HIL or HTL layers). These devices and materials are of interest in, for example, monochrome and colored flat panel displays, organic-based light emitting diodes (OLEDS), signage, and white lighting.

It is of a great importance to improve the performance of currently existing devices including enhancing their efficiencies, longevity, tunability, as well as non-corrosiveness and better processability of the constituents. In particular, there is a demand for materials which can be easily processed from organic solvents and spin-cast onto electrodes to form very thin films having smooth, planar surfaces. Furthermore, lifetime stability, batch-to-batch reproducibility, resistivity control, and combinations of these properties are also of a great importance.

OLED materials and applications are generally described in Kraft et al., Angew. Chem. Int. Ed., 1998, 37, 402-428. One report showed unsatisfactory results in blending a conducting polymer system, PEDOT, with another polymer in HIL applications. See Elschner et al. (Bayer AG), Asia Display, IDW '01, pages 1427-1430. One reference describes problems with acidity in similar systems. See Gong et al., Applied Physics Letters, 83, no. 1, Jul. 7, 2003, pages 183-185. Polymer light emitting devices are called PLEDs.

SUMMARY

This invention describes, among other things, compositions that can function as hole injection or hole transport layers in organic electroluminescent devices. Advantages provided include better lifetimes and better efficiencies for OLED devices. The present application included compositions, methods of making compositions, methods of using compositions, and devices made from compositions. The compositions can be wet or dry. Ink formulations are provided which can be coated or printed and dried to a suitable dryness for the particular application.

One embodiment provides a blend composition for use in a hole injection layer or hole transport layer comprising the following components: (i) at least one intrinsically conductive polymer or copolymer, (ii) at least one dopant for the conductive polymer or copolymer; and (iii) at least one planarizing agent, wherein the planarizing agent is a synthetic polymer; wherein the components are soluble in non-aqueous solvents and are formulated to form a compatible blend when the composition is in the form of a hole injection layer or hole transport layer less than about 200 nm thick.

Another embodiment provides an electroluminescent device comprising a hole injection layer or hole transport layer comprising the following components: (i) at least one intrinsically conductive polymer or copolymer soluble in non-aqueous solvent, (ii) at least one dopant for the conductive polymer or copolymer; and (iii) at least one planarizing agent, wherein the planarizing agent is a synthetic polymer soluble in non-aqueous solvent; wherein the hole injection layer or hole transport layer is less than about 200 nm thick.

One embodiment provides a blend composition for use in a hole injection layer or hole transport layer comprising the following components: (i) at least one intrinsically conductive polymer or copolymer, wherein the intrinsically conductive polymer or copolymer is a regioregular 3-substituted polythiophene; (ii) at least one dopant for the conductive polymer or copolymer; and (iii) at least one planarizing agent, wherein the planarizing agent is a synthetic polymer; wherein the components are soluble in non-aqueous solvents and are formulated to form a compatible blend when the composition is in the form of a hole injection layer or hole transport layer less than about 100 nm thick.

Non-aqueous materials, non-acidic material, and tunable materials can be formulated to provide better performance. The pH of the materials can be near neutral and substantially non-corrosive against light emitting polymers and standard ITO materials. Organic solvent based inks, without substantial water content, can have improved processability. The tunability can be adjusted for use as needed with different light emitters including emitters of different colors and blends of emitters. Acid can be used but in smaller amounts that do not provide as much corrosive impact and without use of water which increases the corrosive effect of acid.

DETAILED DESCRIPTION

Figure 1:
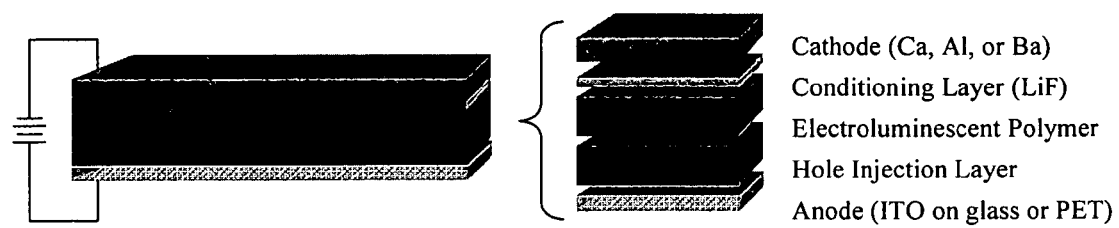
FIG. 1. Schematic representation of an organic light emitting diode (OLED).

Priority provisional application 60/651,211 filed Feb. 10, 2005 is incorporated herein by reference including the summary section, the claims, the figures, and working examples. One embodiment provides a blend composition for use in a hole injection or hole transport layer comprising of at least one of the following components: (i) at least one intrinsically conductive polymer or copolymer, (ii) zero, one, or more oxidatively or reductively doping materials for the conductive polymer or copolymer, and (iii) zero, one, or more matrix components, wherein the components are soluble in non-aqueous solvents and are formulated to form a compatible blend when the composition is in the form of a hole injection or hole transport layer less than about 200 nm thick, and preferably less than 100 nm thick.

Another embodiment provides a blend composition for use in a hole injection or hole transport layer comprising of at least one of the following components: (i) at least one intrinsically conductive polymer or copolymer, (ii) zero, one, or more oxidatively or reductively doping materials for the conductive polymer or copolymer, and (iii) zero, one, or more buffering or planarizing agent(s), wherein the components are soluble in non-aqueous solvents and are formulated to form a compatible blend when the composition is in the form of a hole injection or hole transport layer less than about 200 nm thick, and preferably less than 100 nm thick.

The present invention also provides, in one embodiment, an HIL/HTL system which is comprised of a conductive polymer or copolymer, a dopant system, and a planarizing agent, all of which are formulated as a non-aqueous solution and applied as a layer of an electroluminescent device. The present invention also provides methods of making electroluminescent devices and methods of using electroluminescent devices. Mixtures of non-aqueous solvents can be used. Mixtures of non-conductive components can be used.

In one embodiment, a basic and novel feature of the invention is that the hole injection layer is formulated to be substantially free from water, substantially free of acid, substantially free of residual ionic or metal impurities, or substantially free of all there above.

In practicing the present invention in its various embodiments, the following description of the technical literature and the various components can be used. The references cited throughout the specification including the list at the end are hereby incorporated by reference in their entirety.

Provisional patent application Ser. No. 60/612,640 filed Sep. 24, 2004 to Williams et al. ("HETEROATOMIC REGIOREGULAR POLY(3-SUBSTITUTEDTHIOPHENES) FOR ELECTROLUMINESCENT DEVICES") and US regular application Ser. No. 11/234,374 filed Sep. 26, 2005 are hereby incorporated by reference in their entirety including the description of the polymers, the figures, and the claims.

Provisional patent application Ser. No. 60/612,641 filed Sep. 24, 2004 to Williams et al. ("HETEROATOMIC REGIOREGULAR POLY (3-SUBSTITUTEDTHIOPHENES) FOR PHOTOVOLTAIC CELLS") and US regular application Ser. No. 11/234,373 filed Sep. 26, 2005 are hereby incorporated by reference in their entirety including the description of the polymers, the figures, and the claims.

Provisional patent application Ser. No. 60/628,202 filed Nov. 17, 2004 to Williams et al. ("HETEROATOMIC REGIOREGULAR POLY (3-SUBSTITUTEDTHIOPHENES) AS THIN FILM CONDUCTORS IN DIODES WHICH ARE NOT LIGHT EMITTING") and US regular application Ser. No. 11/274,918 filed Nov. 16, 2005 which are hereby incorporated by reference in their entirety including the description of the polymers, the figures, and the claims.

Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, $2^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

In addition, electrically conductive polymers are described in *The Encyclopedia of Polymer Science and Engineering*, Wiley, 1990, pages 298-300, including polyacetylene, poly (p-phenylene), poly(p-phenylene sulfide), polypyrrole, and polythiophene, which is hereby incorporated by reference in its entirety. This reference also describes blending and copolymerization of polymers, including block copolymer formation.

Polythiophenes are described, for example, in Roncali, J., *Chem. Rev.* 1992, 92, 711; Schopf et al., *Polythiophenes: Electrically Conductive Polymers*, Springer: Berlin, 1997.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and $-(AB)_n$-multiblock copolymers (chapter 7), which can form the basis of block copolymer types in the present invention.

Additional block copolymers including polythiophenes are described in, for example, Francois et al., *Synth. Met.* 1995, 69, 463-466, which is incorporated by reference in its entirety; Yang et al., *Macromolecules* 1993, 26, 1188-1190; Widawski et al., *Nature (London), vol.* 369, Jun. 2, 1994, 387-389; Jenekhe et al., *Science,* 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804;

Electroluminescent Devices and Conjugated Polymers Generally

This invention provides among other things a hole injection layer or hole transport layer (HIL or HTL, used interchangeably) system which comprises of an intrinsically conductive polymer or copolymer, a dopant system, and a planarizing agent, all of which can be formulated as a non-aqueous solution and applied as a layer of an electroluminescent device. The present invention also provides methods of making electroluminescent devices and methods of using electroluminescent devices.

The use of this system in electroluminescent devices offers several desirable properties such as, for example, increased luminescence of the device; lower threshold voltage; longer lifetime; ease of processability of materials and components during device fabrication; the ability to use spin casting, drop casting, and printing techniques to apply the hole injection or hole transport layer in electroluminescent devices; the ability to prepare more flexible electroluminescent devices; the ability to prepare low-weight electroluminescent devices; and the ability to prepare low-cost electroluminescent devices.

For purposes of the present invention, an electroluminescent device can be an electrochemical device that converts current to electromagnetic radiation. The value of such a device is that it is an efficient way to produce light at low voltage and minimal radiant heat. These devices currently find uses in many consumer electronics. Generally speaking, these devices can be called organic light emitting diodes, or OLEDs.

OLEDs were first designed in the early 1990s and were based on relatively simple structures, where a thin layer of the electroluminescent (EL) polymer was enclosed between a pair of electrodes ((a) Burroughes, J. H.; Bradley, D. D. C.; Brown, A. R.; Marks, R. N.; MacCay, K.; Friend, R. H.; Burn, P. L.; Holmes, A. B. *Nature* 1990, 347, 539. (b) Friend, R. H.; Bradley, D. D. C.; Holmes, A. B. *Physics World* 1992, 5, 42).[1] Although the present invention is not limited by theory, when a voltage is applied at the electrodes, the positive (anode) and the negative (cathode) electrodes can provide injection of holes and electrons, respectively, into the EL conjugated polymer. In the EL polymer layer, electrons and holes move towards each other in the applied electrical field and combine to form excitons, which are bound excited states that can relax down into the ground state radiatively by emitting a photon (typically with wavelengths in the visible range). This process is also called electroluminescence. However, these early relatively simple devices were not particularly efficient; they emitted few photons relative to the number of charges injected. As the OLED technology evolved, better understanding of the electrode/polymer interfaces has led to the development of new, more advanced and efficient devices.

Current EL devices are typically comprised of five components as depicted in FIG. 1: anode, hole injection/transport layer, electron transport layer (ETL) which is comprised of EL polymer, conditioning layer, and cathode. Exemplary materials are noted in FIG. 1.

For example, the anode, typically a high work-function material about 100 nm thick, can be made of indium tin oxide (ITO), coated onto a plastic or glass substrate. The ITO-substrate composition is optically transparent and thus allows light emission from the device. Deposition methods that are used to apply the ITO to the substrate result in a rough, uneven surface that could potentially limit or impair performance of the device.

The cathode can be made of a low work-function metal like calcium or aluminum so that electrons can be easily injected. It can be at least 100-200 nm thick.

The cathode can be coated with a few Angstroms thick conditioning layer, for example, alkali-metal fluoride (e.g., 0.3-0.7 nm of LiF), which increases the lifetime and performance of the cathode. In some cases, the cathode can also be coated onto a supporting surface such as a plastic or glass substrate.

Conventional OLEDs include a layer between the ITO and the EL polymer that planarizes the anode surface and facilitates the transfer of positive charge (or "holes") from the anode to the EL polymer. This layer, which is typically about 60 to 100 nm thick, can be referred to as the hole injection layer (HIL) or hole transporting layer (HTL) and can be made of conjugated conducting polymers or small organic molecules.

The EL layer or ETL can be about 100 nm thick and is frequently comprised of poly(phenylene vinylenes), poly(fluorene) materials, or complexes of organic transition metals with small molecules. When a hole and an electron combine, they form an exciton in the EL polymer, which typically relaxes back to the ground state by emitting a photon. These materials have conduction band energies of 1.5-3.0 eV. So, the light is typically in visible range of the spectrum. Therefore, these materials are chosen for the efficiency and wavelength at which they emit photons when electrons and holes combine in the applied electrical field.

Organic electroluminescent devices can take a variety of forms, each actively undergoing advanced research and/or commercialization. OLEDs, a term often used to refer to the broad technology of organic light emitting diodes, is also specifically used for the LEDs that incorporate small organic molecules as the ETL, typically vacuum deposited. LEDs comprised of electroluminescent polymers that are generally solution processed (similar to inks) are commonly referred to as PLEDs (Polymer Light Emitting Diodes). There are other novel devices being designed that do not conveniently fit either description. For example, mixtures of an EL material and a solid electrolyte form a light-emitting electrochemical cell (LEEC). For the majority of applications, the EL layer can be designed to emit specific colors such as red, green, and blue, which can then be combined to create the full spectrum of colors as seen by the human eye. In addition, EL layers can also be designed to emit white light, either for white lighting applications or to be color filtered for a full-color display application.

OLEDs can be assembled to make full color or monochrome flat panel displays. They may be passive matrix displays, where HIL and ETL are sandwiched between strips of anode and cathode materials that are deposited orthogonally to each other. Current flowing through one anode and one cathode strip causes the intersection point to emit light as a single pixel in a display. OLEDs may also be active matrix displays, where there is a backplane of circuitry with transistors at each pixel controls the pixel current and thus the brightness of each individual pixel. Active matrix displays, like passive matrix displays, are typically "bottom emitting" devices where the light exits down through the substrate. In an active matrix display, the light must also pass either through or beside the transistor circuitry. Alternate "top emitting" structures are being developed where the light exits through the device cathode, i.e., in the opposite direction of the substrate and layers that contain the transistor circuitry.

Measuring OLED Performance

Performance of an electroluminescent device can be determined by measurement of the intensity of the light energy that is emitted (e.g., candelas per square meter, $Cd/m^2$), the efficiency by which current is converted to light (e.g., lumens output per watt input, lumens/W), and by the lifetime of the device (e.g., thousands of hours). The color of light emitted can be also an important consideration in the design of these devices.

The external quantum efficiency ($\eta_{EL}$), the number of emitted photons per injected electron or hole of an OLED, is influenced by several factors: the photoluminescence (PL) efficiency, light outcoupling ($\xi$), the singlet-triplet ratio ($r_{ST}$), the recombination efficiency ($\gamma$), and charge balance. For example, a standard device structure and yellow-emitting poly(phenylenevinylene) (PPV) polymer have been shown to give a product of these factors with an external efficiency of 4%. Optimizing these factors to obtain higher efficiencies is a primary goal for OLED manufacturers.

Recent studies suggest that in ideal high-brightness EL devices, constructed with luminescent π-conjugated polymers, high EL efficiency ($\eta_{EL}$) could be achieved (more than 25% conversion of energy into light). Polymers with longer polymer chains (high molecular weight) could increase the percentage to as high as 50% (Shuai, Z.; Beljonne, D.; Silbey, R. J.; Bredas, J. L. *Phys. Rev. Lett.* 2000, 84, 131).[2] The theoretical equation for determining the external quantum efficiency $\eta_{EL}$ of the OLED is $$\eta_{EL} = \xi \gamma r_{ST} \eta_{PL} \qquad \text{Eq. 1}$$

where $\xi$ is the out-coupling efficiency, $\gamma$, is the recombination efficiency, $r_{ST}$ is the ratio of singlet excitons (SE) to triplet excitons (TE) formed from the recombining charge carriers, and $\eta_{PL}$ is the photoluminescence (PL) quantum yield. In order to illuminate this equation further, each parameter will be briefly discussed in turn (Shinar, J. *Organic Light-Emitting Devices*, Springer-Verlag New-York, Inc. 2004, 30).[3]

The out-coupling efficiency $\xi$ (i.e., the fraction of the photons that are emitted from the front surface of the device) depends on the refractive index of the emitter layer n and is equal to $A/n^2$, where $A \approx 0.75 \pm 0.1$ and $1.2 \pm 0.1$ for isotropic and in-plane dipoles, respectively. For an emitter of large refractive index and for isotropic dipoles not subjected to optical interference with the cathode reflector, $\xi$ is about $0.5/n^2$ (Kim, J.-S.; Ho, P. K. H.; Greenham, N.C.; Friend, R. H. *J. Appl. Phys.* 2000, 88, 1073).[4]

The recombination efficiency $\gamma$ is simply a measure of the fraction of electrons and holes which combine with each other. It can also be described as a measure of the balance between hole and electron injection, and has values of $\leq 1$. It has been argued that in the relatively efficient OLEDs studied to date, the recombination efficiency is close to 1 (Kim, J.-S.; Ho, P. K. H.; Greenham, N. C.; Friend, R. H. *J. Appl. Phys.* 2000, 88, 1073).[4] This factor is optimized by varying the composition and thickness of the various layers, and monitoring the response of the I(V) and $I_{EL}(V)$ curves to these variations. Strong injection of majority carriers (usually holes) leads to decreased efficiency. Therefore, devices that operate in the injection-limited current regime are regarded as highly efficient.

Fluorescent emitting polymers require a SE for light emission. The $r_{ST}$ ratio of SEs to TEs formed from recombination of polaron pairs is determined from spin statistics and equals to 0.25. However, as it was mentioned above, recent studies suggest that the ratio could be much higher than theoretically predicted (Shuai, Z.; Beljonne, D.; Silbey, R. J.; Bredas, J. L. *Phys. Rev. Lett.* 2000, 84, 131).[2]

Each SE can either fluoresce light or decay through a non-radiative process. This is captured by the PL quantum yield $\eta_{PL}$, which is lower when there are more nonradiative decay paths. In many luminescent materials, the PL quantum yield $\eta_{PL}$ reaches almost 100% in solution; however, it drops down as the concentration increases, a process known as "concentration quenching." In light emitting (LE) polymers, such as PPVs, $\eta_{PL}$ exceeds 20% and may be as high as 60% in diphenyl substituted polyacetylenes (Gontia, I.; Frolov, S. V.; Liess, M.; Ehrenfreund, E.; Vardeny, Z. V.; Tada, K.; Kajii, H.; Hidayat, R.; Fujii, A.; Yoshino, K.; Teraguchi, M.; Masuda, T. *Phys. Rev. Lett.* 1999, 82, 4058).[5]

While efficiency is important, another important issue for the commercialization of PLEDs is their long-term stability or lifetime. This can be enhanced by improving the stability of the light-emitting material, the device (e.g., the lifetime strongly depends on the type of cathode), and/or by improving the processing conditions.

Hole Injection Technology

Although there are promising advances, performance of commercial LEDs has not yet reached levels that will trigger wide-spread commercialization in diverse markets. The role of the HIL in increasing efficiency, extending lifetime, and lowering threshold voltage can be an important factor for commercial breakthroughs. The purpose of the HIL in the function of an OLED is to among other things: (a) allow for the efficient injection and transport of holes from the anode to the light-emitting layer by bridging the energy gap between these two layers (Shinar, J. *Organic Light-Emitting Devices*, Springer-Verlag New-York, Inc. 2004, 9),[3] (b) block electrons from flowing out of the emitting layer and into the anode without recombination ($\gamma$) (Kraft, A.; Grimsdale, A. C.; Holmes, A. B. *Angew. Chem. Int. Ed.* 1998, 37, 403),[6] (c) block oxygen diffusion from the ITO anode into the EL polymer and prevent degradative oxidation (Shinar, J. *Organic Light-Emitting Devices*, Springer-Verlag New-York, Inc. 2004),[3] and (d) planarize the anode surface to prevent shorts between layers that reduce device lifetime and efficiency (de Kok, M. M.; Buechel, M.; Vulto, S. I. E.; van de Weijer, P.; Meulenkamp, E. A.; de Winter, S. H. P. M.; Mank, A. J. G.; Vorstenbosch, H. J. M.; Weijtens, C. H. L.; van Elsbergen, V. *Phys. Stat. Sol.* 2004, 201, 1342).[7]

Thus, an effective HIL enables holes and electrons to be more evenly concentrated in the emitting layer, maximizes recombination in the EL layer at low power input levels, and enhances device performance in most or all of the categories listed above. The dense film structure and morphology of a well-applied film provide a uniform conducting path for hole migration to the EL/HIL interface, which could lead to decreased turn-on voltages and to superior luminescent performance (Chen, S.; Wang, C. *Appl. Phys. Lett.* 2004, 85, 765).[8]

Commercially Available HILs include poly(ethylenedioxythiophene): polystyrenesulfonate (PEDOT-PSS) (de Kok, M. M.; Buechel, M.; Vulto, S. 1. E.; van de Weijer, P.; Meulenkamp, E. A.; de Winter, S. H. P. M.; Mank, A. J. G.; Vorstenbosch, H. J. M.; Weijtens, C. H. L.; van Elsbergen, V. *Phys. Stat. Sol.* 2004, 201, 1342)[7] and poly(aniline): polystyrenesulfonate (PANI-PSS) and small molecule aryl amines (Shirota, Y. K., Y.; Inada, H.; Wakimoto, T.; Nakada, H.; Yonemoto, Y.; Kawami, S.; Imai, K. *Appl. Phys. Lett.* 1994, 65, 807)[9] (e.g., N,N'-diphenyl-N,N'-bis(1-naphthylphenyl)-1,1'-biphenyl-4,4'-diamine (NPB)). These technologies deliver some positive impact on OLED device performance and lifetime because, for a limited time, they protect the EL layer from oxidation by adventitious oxygen diffusing out of the ITO. In addition, they planarize the ITO surface, thereby eliminating device shorts. However, there are significant drawbacks to the use of these materials as HILs which ultimately limit performance, longevity, and impede the widespread commercialization of OLEDs. These limitations include: (a) PEDOT-PSS and PANI-PSS are aqueous dispersions that require slow drying processes that increase tact time by 15 times that of solvent-based processes (Book, K. B.; Elschener, A.; Kirchmeyer, S. Organic Electronics 2003, 4, 227).[10] Moreover, residual water may promote OLED degradation by the oxidation of the EL polymer and the cathode (Kugler, T.; Salaneck, W. R.; Rost, H.; Holmes, A. B. *Chem. Phys. Lett.* 1999, 310, 391).[11] (b) PEDOT-PSS requires a binder to wet glass surfaces when deposited into an OLED device (Book, K. B.; Elschener, A.; Kirchmeyer, S. Organic Electronics 2003, 4, 227).[10] (c) Both PEDOT-PSS and PANI-PSS are inherently doped and offer very limited tenability of the oxidized state. (d) In addition, conventional HILs such as of PEDOT-PSS and PANI-PSS are intrinsically acidic, which causes the ITO to degrade and leach indium into the hole transport layer ((a) de Jong, M. P.; de Voigt, M. J. A.; *Appl. Phys. Lett.* 2000, 77, 2255. (b) Schlatmann, A. R.; Floet, D. W.; Hilberer, A.; Garten, F.; Smulders, P. J. M.; Klapwijk, T. M.; Hadziioannou, G. *Appl. Phys. Lett.* 1996, 69, 1764).[12] (e)

Aryl amines must be applied to the material by expensive vacuum deposition processes (Shirota, Y. K., Y.; Inada, H.; Wakimoto, T.; Nakada, H.; Yonemoto, Y.; Kawami, S.; Imai, K. Appl. Phys. Lett. 1994, 65, 807).[9] (f) Arylamines such as N,N'-diphenyl-N,N'-bis(3-methylphenyl)-1,1'-biphenyl-4, 4'-diamine (TPD) tend to have poor morphological stability and do not adequately planarize the ITO surface. (g) Arylamines can be dispersed in polymers such as polycarbonates to improve morphological stability and promote film formation, but the hole transport efficiency is drastically reduced (Redecker, M. B.; Inbasekaran, M.; Wu, W. W.; Woo, E. P. Adv. Mater. 1999, 11, 241).[13] This indicates that a polymeric material which is inherently an effective hole conductor will be a dramatic improvement over the use of small molecules as hole transport materials.

The next generation of p-type, polymer-based HILs for electroluminescent devices need to show improved properties. These systems can offer advantages in that, in the neutral state, they can be dissolved in common organic solvents and can be easily processed by spin-coating, drop casting, dip-coating, spraying, and printing techniques (such as ink-jetting, off-setting, and transfer-coating) with short tact time. These HIL systems can be processed in large-area formats opening new applications for organic electroluminescent devices as flexible computer screens, flat screen displays, and outdoor advertising. Because these materials are manufactured in the neutral state, they can be processed and then oxidized to a level that is suitable for the application. This offers a greater flexibility in device design. The polymer-based materials also offer several other advantages in performance described further herein.

HIL Systems

Figure 2:
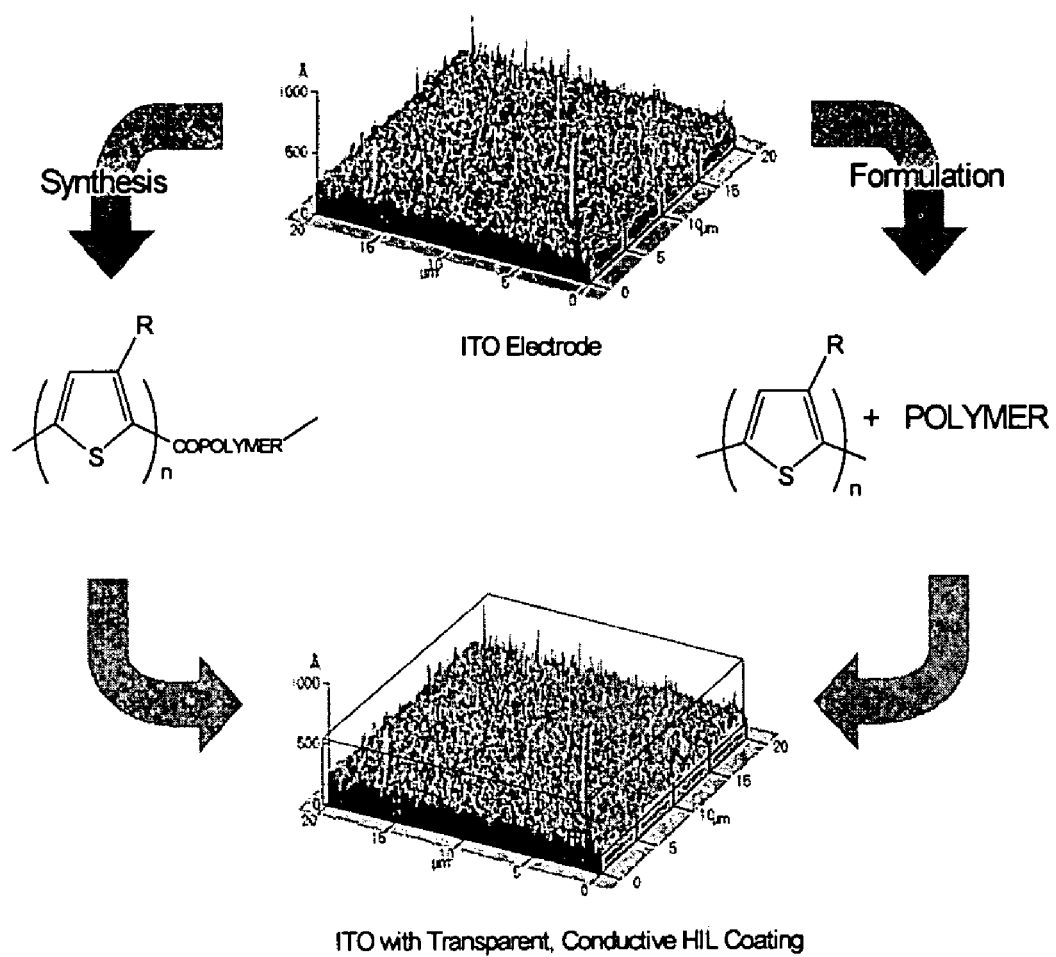
FIG. 2. Two paths to a new HIL, which include a mixture of a conjugate polymer and a bulk plastic, are through synthesis (e.g., copolymers) and formulation. The top picture is an AFM picture of an ITO anode. The bottom picture indicatively shows a smooth planar HIL layer (blue box outline) on top of the ITO. (Figures taken from and updated from G. Liu et al. Synth. Met. 2004, 144, 1.)

In this invention, an HIL system is provided that is comprised of an inherently conductive polymer (ICP) or oligomer or copolymer that contains an ICP segment that functions as the hole injection component of the system, a planarizing agent that dilutes the hole injection component and provides the bulk of the HIL, and the doping agent, that oxidizes the hole injection component, tuning its conductivity such that it is optimal to moderate hole injection in the system (and prevent current flow or "cross talk" between adjacent devices (Gong, X. M. D.; Moses, D.; Heeger, A. J.; Liu, S.; Jen, K. Appl. Phys. Lett. 2003, 83, 183).[14] The planarizing agent can also help to reduce the optical absorbance of the HIL, thereby increasing the efficiency of the OLED in which it is applied. Furthermore, the described HIL system can function as an organizing matrix or supramolecular scaffold that smoothens the ITO surface, thereby eliminating device shorts as exemplary illustrated in FIG. 2. All of these components can be soluble in a non-aqueous solvent that allows the HIL system to be applied in OLED devices. In particular, one embodiment provides a blend composition for use in a hole injection layer or hole transport layer that is comprised of at least one the following components:
  (i) at least one intrinsically conductive polymer or copolymer,
  (ii) at least one dopant for the conductive polymer or copolymer, and
  (iii) at least one planarizing agent, wherein the components are soluble in non-aqueous solvents and are formulated to form a compatible blend when the composition is in the form of a hole injection layer less than about 100 nm thick, and in particular, about 2 nm to about 100 nm thick.

The composition can be formulated by methods known in the art to formulators including, for example, varying the amounts of the components, varying combinations of different structural types, use of different mixing conditions, using different solvents, applying different film preparation conditions, using different purification methods, and the like.

The blend can be compatible when it is not characterized by excessive phase separation and forms functionally useful, mechanically stable films which can function as a hole injection layer. Compatible blends are known in the art. See, for example, U.S. Pat. Nos. 4,387,187; 4,415,706; 4,485,031; 4,898,912; 4,929,388; 4,935,164; and 4,990,557. Compatible blends do not have to be miscible blends, but are sufficiently mixed and stable to provide useful function, particularly in thin film form such as, for example, about 2 nm to about 100 nm. Blending methods may include solution blending of a predissolved conducting polymer either in neutral or oxidized form disintegrated into nanosized particles (typically from tens to hundreds of nanometers) with conventional polymers (e.g., polystyrene (PS), poly(methyl methacrylate) (PMMA), poly(vinyl acetate) (PVA)) by sonicating or agitation. Such blends provide fine dispersion of film-forming submicronic particles of stable polymer matrix solutions. Films can be prepared and analyzed for compatibility by spin coating.

Figure 3:
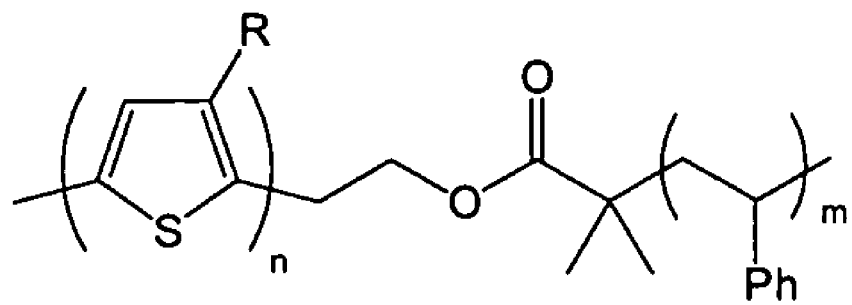
FIG. 3. Two example copolymers synthesized and studied by Plextronics personnel. These are examples of block copolymers of regioregular poly(3-substituted thiophenes) and "thermoplastic" monomers. Copolymers can provide a precisely controllable path to new HIL technology.
Figure 3:
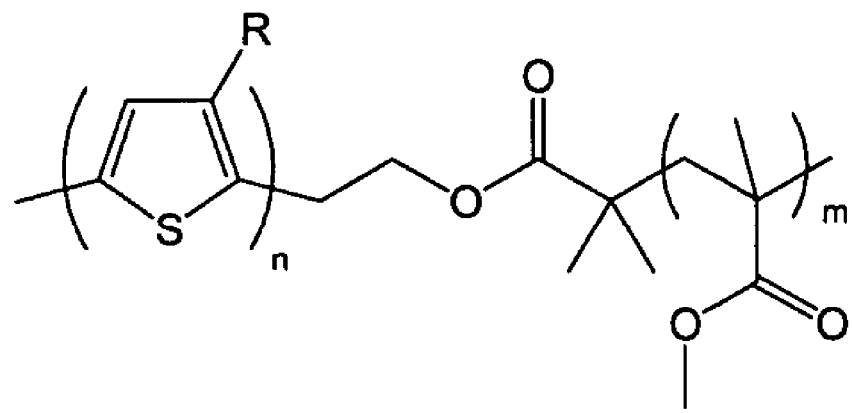
Figure 4:
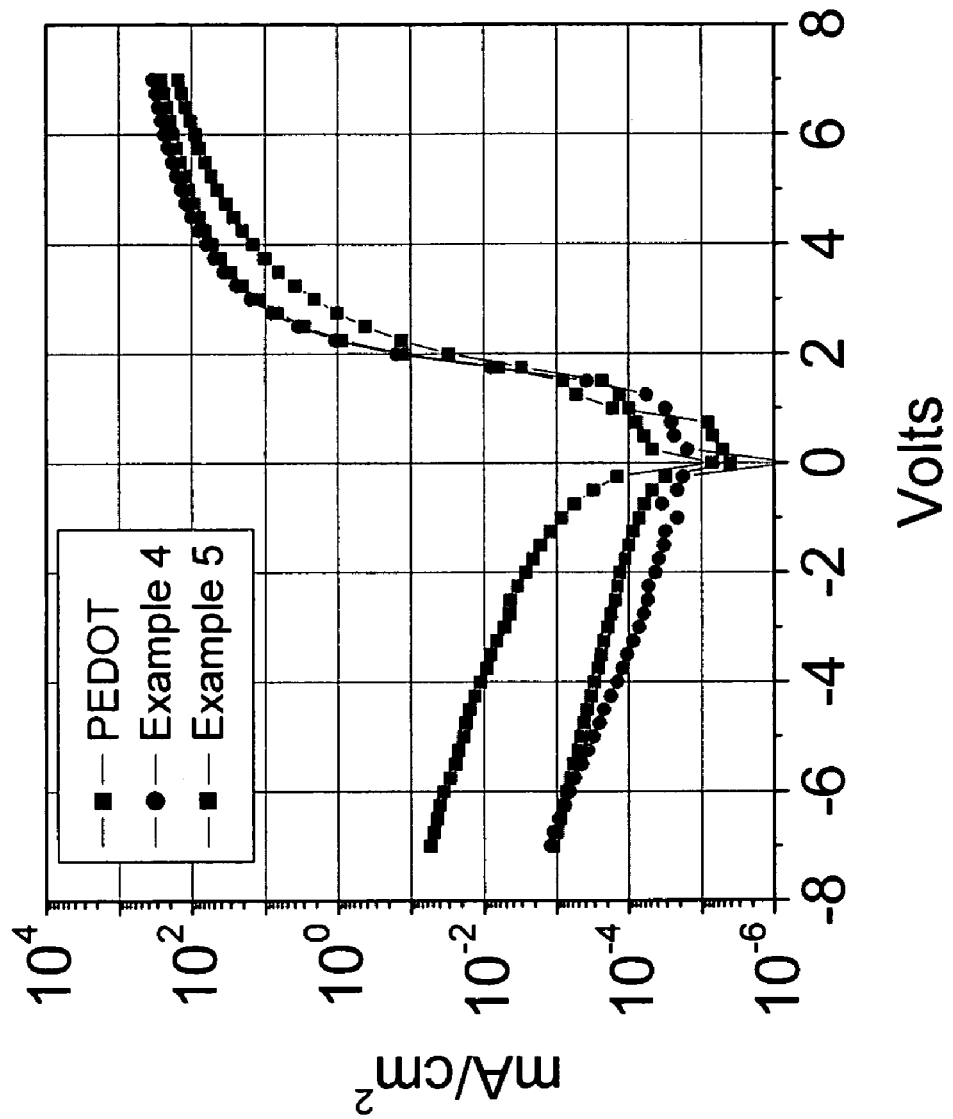
FIG. 4. Current density vs. voltage data for PLED devices comparing different hole injection layers including a commercially available hole injection layer (PEDOT).
Figure 5:
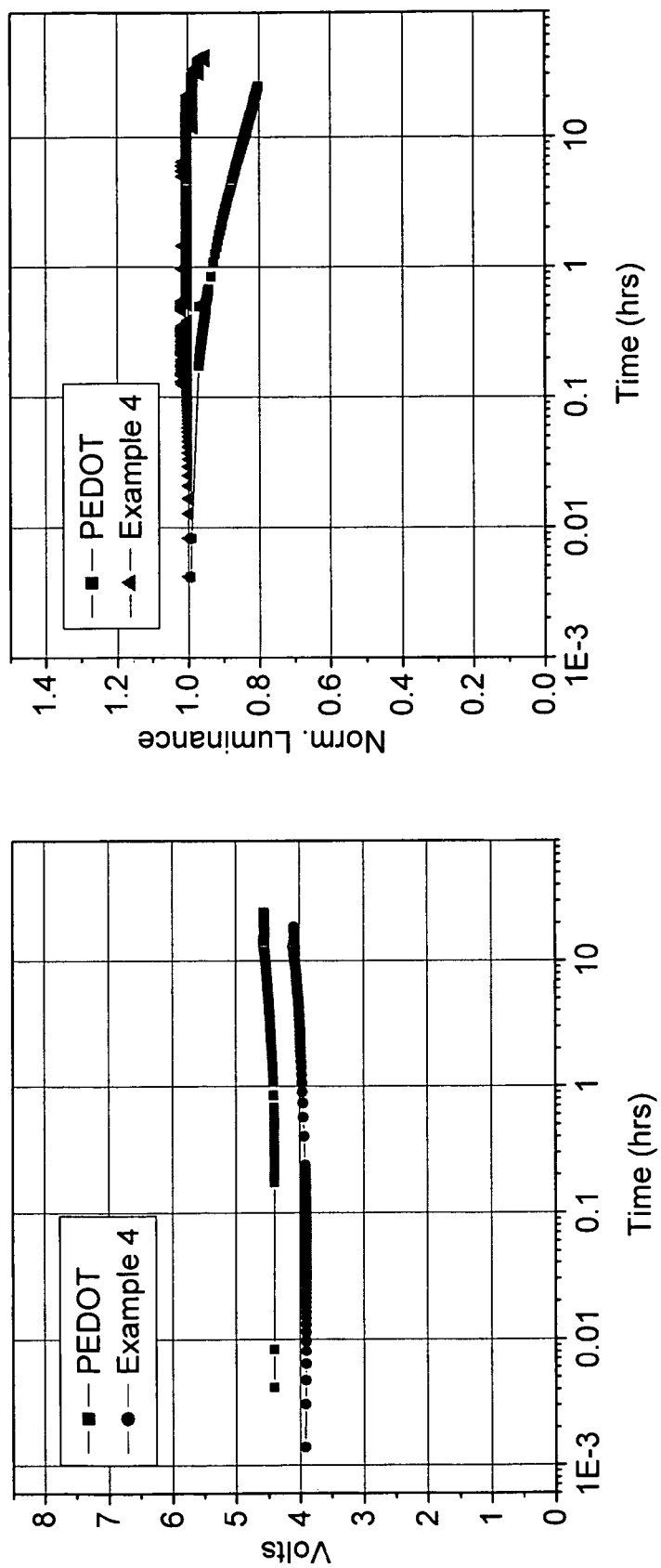
FIG. 5. Change in operating voltage and luminance for PLED devices stressed at 50 mA/cm2 over time, comparing the performance Example 4 with that of a commercial hole injection layer (PEDOT).
Figure 6:
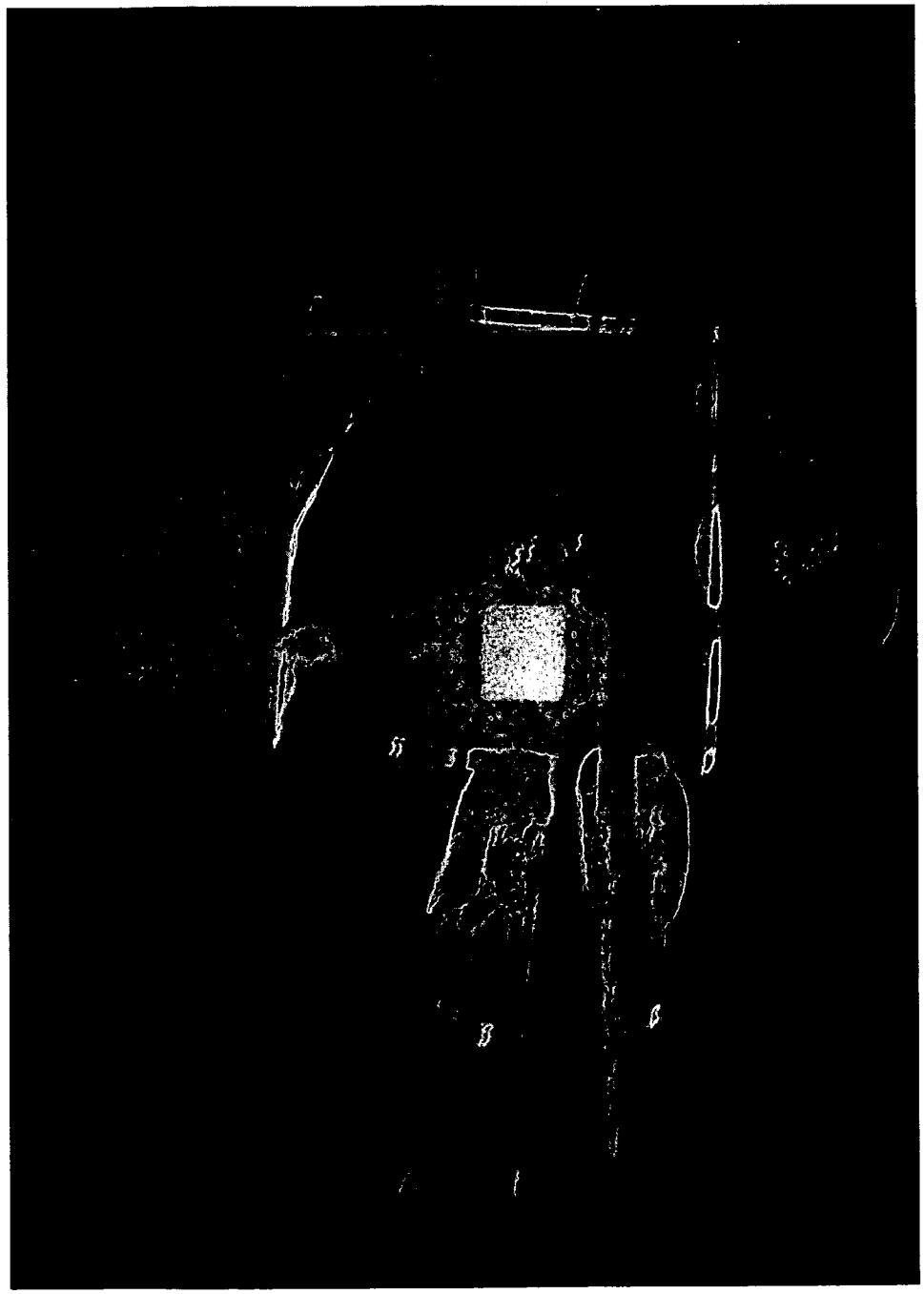
FIG. 6. Photograph of a PLED device showing bright electroluminescence.

In this invention, the ICP and planarizing agent can be conjoined via covalent bonding as a copolymer including a block copolymer. Some examples of copolymer structures are shown in FIG. 3. In this embodiment, a composition is provided for use in a hole injection layer that is comprised of at least one of the following components:
  (i) at least one intrinsically conductive polymer, wherein the intrinsically conductive polymer is covalently bonded to a planarizing agent, and
  (ii) at least one dopant for the conductive polymer, wherein the components are soluble in non-aqueous solvent and the composition is in the form of a hole injection layer about 2 nm to about 100 nm thick.

In this invention, the HIL system can be applied by spin casting, drop casting, dip-coating, spray-coating, or by printing methods such as ink jet printing, off-set printing, or by a transfer process. For example, ink jet printing is described in U.S. Pat. No. 6,682,175 to Otsuka and in Hebner et al., Applied Physics Letters, 72, no. 5, Feb. 2, 1998, pages 519-521.

In this invention, an HIL as a film of an HIL system can be provided that is about 10 nm to about 50 µm in thickness with typical thickness ranging from about 50 nm to about 1 µm. In another embodiment, thickness can be about 10 nm to about 500 nm, and more particularly, about 10 nm to about 100 nm.

Inherently Conductive Polymers

Inherently or intrinsically conductive polymers (ICPs) are organic polymers that, due to their conjugated backbone structure, show high electrical conductivities under some conditions (relative to those of traditional polymeric materials). Performance of these materials as a conductor of holes or electrons is increased when they are either oxidized or reduced. Upon low oxidation (or reduction) of ICPs, the process is frequently referred to as doping, an electron is removed from the top of the valence band (or added to the bottom of the conduction band) creating a radical cation (or polaron). Formation of a polaron creates a partial delocalization over several monomeric units. Upon further oxidation, another electron can be removed from a separate polymer segment, thus yielding two independent polarons. Alternatively, the unpaired electron can be removed to create a dication (or bipolaron). In an applied electric field, both polarons and bipolarons are mobile and can move along the polymer chain by the rearrangement of double and single bonds. Furthermore, this change in oxidation state results in the formation of new energy states. The energy levels are accessible to some of the remaining electrons in the valence band, allowing the polymer to function as a conductor. The extent of this conjugated structure is dependent upon the ability of the polymer chains to form a planar conformation in the solid state. This is because conjugation from ring-to-ring is dependent upon π-orbital overlap. If a particular ring is twisted out of planarity, the overlap cannot occur and the conjugation band structure can be disrupted. Some minor twisting is not detrimental since the degree of overlap between thiophene rings varies as the cosine of the dihedral angle between them.

Performance of a conjugated polymer as an organic conductor can also be dependant upon the morphology of the polymer in the solid state. Electronic properties can be dependent upon the electrical connectivity and inter-chain charge transport between polymer chains. Pathways for charge transport can be along a polymer chain or between adjacent chains. Transport along a chain can be facilitated by a planar backbone conformation due to the dependence of the charge carrying moiety on the amount of double-bond character between the rings. This conduction mechanism between chains can involve either a stacking of planar, polymer segment, called π-stacking, or an inter-chain hopping mechanism in which excitons or electrons can tunnel or "hop" through space or other matrix to another chain that is in proximity to the one that it is leaving. Therefore, a process that can drive ordering of polymer chains in the solid state can help to improve the performance of the conducting polymer. It is well-known that the absorbance characteristics of thin films of ICPs reflect the increased π-stacking which occurs in the solid state.

In this invention, HIL systems are provided which include an ICP as an HIL material in an OLED or PLED. Suitable examples of ICPs for this application include, but are not limited to, regioregular poly(3-substituted thiophene) and its derivatives, poly(thiophene) or poly(thiophene) derivatives, a poly(pyrrole) or poly(pyrrole) derivatives, poly(aniline) or poly(aniline) derivatives, a poly(phenylene vinylene) or poly(phenylene vinylene) derivatives, poly(thienylene vinylene) or poly(thienylene vinylene) derivatives, poly(bis-thienylene vinylene) or poly(bis-thienylene vinylene) derivatives, poly(acetylene) or poly(acetylene) derivatives, a poly(fluorene) or poly(fluorene) derivatives, a poly(arylene) or poly(arylene) derivatives, or a poly(isothianaphthalene) or poly (isothianaphthalene) derivatives.

Derivatives of a polymer can be modified polymers, such as a poly(3-substituted thiophene), which retain an essential backbone structure of a base polymer but are modified structurally over the base polymer. Derivatives can be grouped together with the base polymer to form a related family of polymers. The derivatives generally retain properties such as electrical conductivity of the base polymer.

U.S. Pat. No. 6,824,706 and US Patent Publication No. 2004/0119049 (Merck) also describe charge transport materials which can be used in the present invention, and these references are hereby incorporated by reference in their entirety.

In this invention, a copolymer of these materials can be block-, alternating-, graft-, gradient-, and random-copolymers of which incorporate one or more of the materials defined as an inherently conductive polymer (ICP) such as a regioregular poly(3-substituted thiophene) or its derivatives, poly(thiophene) or poly(thiophene) derivatives, poly(pyrrole) or poly(pyrrole) derivatives, poly(aniline) or poly(aniline) derivatives, a poly(phenylene vinylene) or poly(phenylene vinylene) derivatives, poly(thienylene vinylene) or poly(thienylene vinylene) derivatives, poly(bis-thienylene vinylene) or poly(bis-thienylene vinylene) derivatives, poly(acetylene) or poly(acetylene) derivatives, poly(fluorene) or poly(fluorene) derivatives, a poly(arylene) or poly(arylene) derivatives, or a poly(isothianaphthalene) or poly(isothianaphthalene) derivatives as well as segments composed of polymers built from monomers such as $CH_2CH$ Ar, where Ar=any aryl or functionalized aryl group, isocyanates, ethylene oxides, conjugated dienes, $CH_2CHR_1R$ (where $R_1$=alkyl, aryl, or alkyl/aryl functionality and R=H, alkyl, Cl, Br, F, OH, ester, acid, or ether), lactam, lactone, siloxanes, and ATRP macroinitiators.

In this invention, a copolymer also can be provided as random or well-defined copolymer of an inherently conductive polymer (ICP) such as a regioregular poly(3-substituted thiophene) or its derivatives, poly(thiophene) or poly(thiophene) derivatives, poly(pyrrole) or poly(pyrrole) derivatives, poly(aniline) or poly(aniline) derivatives, poly(phenylene vinylene) or poly(phenylene vinylene) derivatives, poly(thienylene vinylene) or poly(thienylene vinylene) derivatives, poly(acetylene) or poly(acetylene) derivatives, poly(fluorene) or poly(fluorene) derivatives, a poly(arylene) or poly(arylene) derivatives, or a poly(isothianaphthalene) or poly(isothianaphthalene) derivatives as well as a block comprised of one or more functionalized ICP polymer or oligomer copolymer with random or well-defined copolymer comprised of one or more conjugated units. In the case of regioregular copolymer of thiophene derivatives, the comonomers may contain alkyl, aryl, alkyl-aryl, fluoro, cyano, or a substituted alkyl, aryl, or alkyl-aryl functionalities in either the 3- or 4-position of the thiophene ring.

The degree of regioregularity can be, for example, about 90% or more, or about 95% or more, or about 98% or more, or about 99% or more. Methods known in the art such as, for example, NMR can be used to measure the degree of regioregularity.

Matrix Component or Planarizing Agent

In this invention, a matrix component can be used which helps provide the needed properties, such as planarization, for the hole injection or hole transport layers. The matrix component, including planarizing agents, when blended with the hole injection component, will facilitate the formation of the HIL or HTL layer in an OLED device. It will also be soluble in the solvent that is used to apply the HIL system. The planarizing agent may be comprised of, for example, a polymer or oligomer such as an organic polymer such as poly(styrene) or poly(styrene) derivatives, poly(vinyl acetate) or its derivatives, poly(ethylene glycol) or its derivatives, poly (ethylene-co-vinyl acetate), poly(pyrrolidone) or its derivatives (e.g., poly(1-vinylpyrrolidone-co-vinyl acetate)), poly (vinyl pyridine) or its derivatives, poly(methyl methacrylate) or its derivatives, poly(butyl acrylate) or its derivatives. More generally, it can be comprised of polymers or oligomers built from monomers such as $CH_2CH$ Ar, where Ar=any aryl or functionalized aryl group, isocyanates, ethylene oxides, conjugated dienes, $CH_2CHR_1R$ (where $R_1$=alkyl, aryl, or alkyl/aryl functionalities and R=H, alkyl, Cl, Br, F, OH, ester, acid, or ether), lactam, lactone, siloxanes, and ATRP macroinitiators.

More than one non-conductive polymer can be used in the formulation.

In this invention, the planarizing agent and the hole injection component could be represented by a copolymer that contains an ICP segment and a non-conjugated segment with a composition like similar to that described herein (see FIG. 3 for depicted example structures).

In this invention, the planarizing agent can also be a "non-fugitive", small molecule that is soluble in the application solvent, but does not evaporate upon removal of the solvent. It may possess alkyl, aryl, or functional alkyl or aryl character.

In addition to facilitating the providing of a smooth surface to the HIL layer, the matrix component or planarization agent can also provide other useful functions such as resistivity control and transparency control. Planarity can be determined by methods known in the art including AFM measurements.

Doping

The use of an inherently conductive polymer in an HIL application involves a controlled oxidation or "doping" of the polymer to obtain the desired conductive state that can improve performance. Upon oxidation, electrons are removed from the valence band. This change in oxidation state results in the formation of new energy states. The energy levels are accessible to some of the remaining electrons in the valence band, allowing the polymer to function as a conductor.

In a conductive thin-film application, the conductivity can range from about $1 \times 10^{-8}$ S/cm to about $10^4$ S/cm, but most typically it is in the range of about 1 S/cm to about 500 S/cm. The important characteristics of the conductive thin films are that they retain their conductivity for thousands of hours under normal use conditions and meet suitable device stress tests at elevated temperatures and/or humidity. This facilitates an operational range of robust charge mobility and allows the tuning of properties by controlling the amount and identity of the doping species and complements the ability to tune these properties by the varing of the primary structure of the ICP.

There are many oxidants which may be used to tune conductive properties. Molecular halogens such as bromine, iodine, and chlorine offer some advantages. By controlling the amount of exposure of a polymer film to the dopant, the resulting conductivity of the thin film can be controlled. Because of their high vapor pressure and solubility in organic solvents, halogens may be applied in the gas phase or in solution. Oxidation of the polymer greatly reduces the solubility of the material relative to that of the neutral state. Nevertheless, some solutions may be prepared and coated onto devices.

Other examples include iron trichloride, gold trichloride, arsenic pentafluoride, alkali metal salts of hypochlorite, protic acids such as benzenesulfonic acid and derivatives thereof, propionic acid, and other organic carboxylic and sulfonic acids, nitrosonium salts such as $NOPF_6$ or $NOBF_4$, or organic oxidants such as tetracyanoquinone, dichlorodicyanoquinone, and hypervalent iodine oxidants such as iodosylbenzene and iodobenzene diacetate. Polymers may also be oxidized by the addition of a polymer that contains acid or oxidative or acidic functionality such as poly(styrene sulfonic acid).

Some Lewis acid oxidants such as iron trichloride, gold trichloride, and arsenic pentafluoride have been used to dope ICPs via a redox reaction. These dopants have been reported to result in the formation of stable, conductive films. This is primarily accomplished through the treatment of the cast film to a solution of the metal chloride, albeit the casting of doped films is possible but is rarely reported.

Protic organic and inorganic acids such as benzenesulfonic acid and derivatives thereof, propionic acid, other organic carboxylic and sulfonic acids, and mineral acids such as nitric, sulfuric and hydrochloric can be used to dope ICPs.

Nitrosonium salts such as $NOPF_6$ and $NOBF_4$ can be used to dope ICPs by a reaction which produces the stable nitric oxide molecule in an irreversible redox reaction.

Organic oxidants such tetracyanoquinone, dichlorodicyanoquinone, and hypervalent iodine oxidants such as iodosylbenzene and iodobenzene diacetate can also be used to dope ICPs.

These dopants may be solids, liquids, of vapors, depending upon their specific chemical properties. In some cases these dopants may form or be added as complexes with the thermoplastic component of the HIL formulations or coatings.

Another embodiment is ambient doping, wherein the doping agent arises from oxygen, carbon dioxide, moisture, stray acid, stray base, or some other agent in the ambient air or polymer surroundings. Ambient doping can be dependent on factors such as, for example, the presence of solvent and the amounts of impurities.

Non-Aqueous Doping

The non-aqueous solvent is not particularly limited, and solvents known in the art can be used. Organic solvents can be used including halogenated solvents, ketones, ethers, alkanes, aromatics, alcohols, esters, and the like. Mixtures of solvents can be used. For example, one solvent may facilitate dissolution of one component, and another solvent may facilitate dissolution of a different component. Furthermore, processing the constituents from common organic solvents leads to suppression of unwanted water-dependent side reactions, which potentially can degrade organic reagents, thereby drastically affecting device performance and shortening its lifetime. Although water is generally not favored, limited quantities of water may be present in some cases to stabilize desirable dopant properties. For example, water can be present in amounts of 5 wt % or less, 1 wt % or less, or 0.1 wt % or less. One can test the compositions to determine the impact of water at these concentrations. In addition, due to the ability of acidic components to oxidize the EL polymer and the cathode, which promotes OLED degradation, their usage is generally highly undesirable (Kugler, T.; Salaneck, W. R.; Rost, H.; Holmes, A. B. *Chem. Phys. Lett.* 1999, 310, 391).[11]

In this invention, many utilized polymer dissolving solvents ate very hydrophilic, polar, and protic. However, in some cases, in addition to dissolving the constituents in the non-aqueous solvent (although the present invention is not limited by theory), the latter may only highly disperse one or all of the components. For example, the intrinsically conductive polymer may only be highly dispersed as opposed to forming a true solution in the non-aqueous solvent. Homogeneously suspended solids of the ICP, both blended or copolymerized with the planarizing agent and the dopant, form a non-aqueous system that can be easily processed and applied to fabrication of novel HILs for OLEDs. Due to the absence of water-organic solvent interfaces, diffusional limitations of both the substrate and the OLED constituents are eliminated. Furthermore, it allows one to either control the concentrations of the constituents or manipulate/adjust the ranges, or build a database of blending experiments to achieve the best OLED performance. For example, the ICP can be present in amounts of 0.5% to 25 wt %, the planarizing agent can be present in amounts of 0.5% to 70 wt %, and the dopant can be present in amounts of 0.5% to 5 wt %, with the solid content of 1.5% to 5 wt % in organic solvent. Alternatively, the ICP can be present in amounts of 0.5% to 25 wt %, the planarizing agent can be present in amounts of 0.5% to 80 wt %, and the dopant can be present in amounts of 0.5% to 5 wt %, with the solid content of 1.5% to 5 wt % in organic solvent.

Formulation and deposition methods, including ink jet printing, are described in for example WO/02/069,119 to Lyon et al. Ink viscosity can be formulated to allow ink jet printing such as for example about 10 to about 20 cps.

Devices and Fabrication

Methods known in the art can be used to fabricate OLED devices. For example, the methods described in the working examples can be used. Methods known in the art can be used to measure brightness, efficiency, and lifetimes.

Brightness can be, for example, at least 250 $cd/m^2$, or at least 500 $cd/m^2$, or at least 750 $cd/m^2$, or at least 1,000 $cd/m^2$.

Efficiency can be, for example, at least 0.25 Cd/A, or at least 0.45 Cd/A, or at least 0.60 Cd/A, or at least 0.70 Cd/A, or at least 1.00 Cd/A.

Lifetime can be measured at 50 $mA/cm^2$ in hours and can be, for example, at least 900 hours, or at least 1,000 hours, or at least 1100 hours, or at least 2,000 hours, or at least 5,000 hours.

Combinations of brightness, efficiency, and lifetime can be achieved. For example, brightness can be at least 1,000 cd/m2, efficiency can be at least 1.00 Cd/A, and lifetime can be at least 1,000 hours, at least 2,500 hours, or at least 5,000 hours.

Control materials can be formulated such as PEDOT materials described in U.S. Pat. No. 4,959,430 to Jonas et al. Carbazole compounds are described in for example WO 2004/072205 to Brunner et al.

The invention is further described with use of the following non-limiting working examples.

EXAMPLES

Example A

General Procedure for Preparation of an HIL System Used for Fabrication of PLED HTLs 1) Prior to use, pyridine was dried over and distilled from calcium hydride under nitrogen. Commercial chemical, poly(vinylpyrrolidone) iodine complex (PVP-I), was purchased from Aldrich Chemical Co., Inc. and used without further purification. This was used as a planarization agent, and also served as a carrier of the doping agent, molecular iodine.
2) Plexcore MP, a soluble regioregular 3-substituted polythiophene (Plextronics, Pittsburgh, Pa.), was polymerized using the Grignard Metathesis (GRIM) method (Lowe, R. S.; Khersonsky, S. M.; McCullough, R. D. *Adv. Mater.* 1999, 11, 250).[15] Generally, the reaction conditions employed are identical to that applied for the polymerization of regioregular poly(3-substituted thiophenes) where the synthetic route involves the treatment of 2,5-dibromo-3-substituted thiophene with an equimolar amount of Grignard reagent, R'MgX (where X can be either Br or Cl). Upon addition of Ni(dppp)$Cl_2$, the polymer is formed by the selective coupling of a monobromo-halomagnesio-3-substituted thiophene to afford a highly regioregular (more than 98% head-to tail couplings) polymer as dark purple/blue solid. In general, the GRIM polymerization yields Plexcore MP of relatively high molecular weight (e.g., $M_n$=18,000 Da; $M_w/M_n$=1.6). Since the polymerization proceeds by a chain-growth mechanism ((a) Sheina, E. E.; Liu, J.; Iovu, M. C.; Laird, D. W.; McCullough, R. D. *Macromolecules* 2004, 37, 3526. (b) Yokoyama, A.; Miyakoshi, R.; Yokozawa, T. *Macromolecules* 2004, 37, 1169),[16] polymers of varying molecular weights can be easily synthesized. Moreover, incorporation of different substituents in a polymer backbone results in polymers that are readily soluble in many common organic solvents and possess excellent film-forming abilities.
3) A dry 500-mL one-neck flask with a flat bottom was flushed with $N_2$ and was charged with Plexcore MP (2.95 g) and pyridine (441 mL), in which the solvent was added via graduated cylinder
4) The polymer solution was sonicated for 40 minutes to 1 hour, where the sonicating bath was preheated to about 62° C. The dissolved polymer was filtered through polytetrafluoroethylene (PTFE) 0.45 μm filter.
5) PVP-I (8.85 g, 3 portions to 1 portion of Plexcore MP was added in portions (note, the components were stirred using the "vortex mixer" in between additions for 1 minute).
6) Dry 4 oz. (125-mL) amber-glass containers were flushed with $N_2$ and were charged with 100 mL of the filtered HIL solution.
7) The containers were sealed with electrical tape and sonicated for additional 10 minutes at 62° C.

Example B

General Procedure for Spinning of the HIL System for Fabrication of PLED HTLs

Note, all of the steps presented in this example should be preferably performed in a clean room atmosphere.

Before the polymer blend solution is deposited onto an ITO surface, pre-conditioning of the ITO surface is performed according to the following procedure (Note, each step is 20 minutes long):

1) Ultrasonic (US) agitation of the substrates with DI water with detergent.
2) US agitation of the substrates with DI water.
3) US agitation of the substrates with Acetone.
4) US agitation of the substrates with Isopropyl alcohol.
5) Blow dry each substrate one at the time with dry nitrogen.
6) Transfer the substrates to vacuum oven set at 120° C., keep under partial vacuum (stream of nitrogen purges the oven) till used for experiment.
7) Ozone treatment for 20 minutes prior to experiment.

Furthermore, before the polymer blend solution is deposited onto an ITO surface, filtering of the polymer solution through PTFE 0.45 μm filter is performed. If an increasing pressure is required to pass the polymer blend solution through a filter, then the filter should be replaced.

Generally, the thickness of the HIL after spin-coating onto the ITO-patterned substrates is determined by several parameters such as spin speed, spin time, substrate size, quality of the substrate surface, and the design of the spin-coater. Therefore, providing general rules for obtaining certain layer thickness is omitted. As an example, the following conditions were applied to achieve uniformly dispersed films of the polymer blend solutions and the obtained results are correspondingly presented:

1) The substrate size was 2×2 inch ITO patterned glass substrates (Polytronics) pre-conditioned as described above.
2) About 1 to 2 mL of the polymer blend solution was applied to the substrate such that the solution would cover most of the substrate surface.
3) The spinning results were obtained using a spin coater with a custom-made recessive chuck, which allowed to provide an all around support for the substrate during spin-coating holding it at four corners.
4) The spinning was divided into two consecutive cycles. The first cycle was performed at lower rotations per minute (RPM) to allow a uniform spreading of the solution over the entire substrate surface (e.g., 1.2 seconds at 300 RPM). The second spinning cycle was set for 40 seconds at 2600 RPM to obtain homogeneous layer-thickness across the substrate.
5) After spin-coating, the HIL layer is dried for 10 minutes at 100-120° C. on a hot plate on air.
6) Layer thickness of 60-65 nm was measured by a DekTak Profilometer and was found to be uniform across the substrate with a small increase at the edges of the substrate.
7) In general, the films were transparent (e.g., transmittance (% T) was above 83%) and homogeneous.

ADDITIONAL WORKING EXAMPLES

Representative Procedure for Single-Component HIL Inks for Examples 1-5:

A stock solution of Plexcore MP in DMF (0.8% by weight) was prepared. This stock solution was heated to 110° C. for 3 hours under a nitrogen atmosphere and then allowed to cool to room temperature. 7.5 g of this stock solution was removed and placed in an ultrasonic bath for 30 minutes. p-Toluenesulfonic acid (or DDBSA) was then added and the solution was returned to the ultrasonic bath for 30 minutes. Poly(4-vinylpyridine) (or poly(4-vinylphenol)) was dissolved in DMF (or DMF/Dowanol PM Acetate mixture) and placed in the ultrasonic bath for 30 minutes. The two solutions were then combined and put back in the ultrasonic bath for 30 more minutes. The solution was then passed through a 0.45 micron PTFE syringe filter. A solution of dichlorodicyanoquinone was then added to the filtered solution (170 mg of DDQ was added to 1.0 mL of DMF; 0.1 mL of this solution was added via syringe).

Device Fabrication:

The device fabrication described below is intended as an example and does not in any was imply the limitation of the invention to the said fabrication process, device architecture (sequence, number of layers etc.) or materials other than the HIL materials claimed in this invention.

The OLED devices described herein were fabricated on indium tin oxide (ITO) surfaces deposited on glass substrates. The ITO surface was pre-patterned to define the pixel area of 0.9 cm². The device substrates were cleaned by ultrasonication in soap followed by distilled water for 20 minutes each. This was followed by ultrasonication in a beaker of isopropanol. The substrates were dried under nitrogen flow, following which they were treated under a UV-Ozone chamber operating at 300 W for 20 minutes.

The cleaned substrates were then coated with the hole injection layer. The coating process was done on a spin coater but can easily be similarly achieved with spray coating, ink-jetting, contact printing or any other deposition method capable of resulting in an HIL film of the desired thickness. This was followed by the spin coating of the light emitting layer which in this example is a commercial poly(p-phenylene vinylene) (PPV) based fluorescent polymer. The polymer layer was measured to be ca. 70 nm thick.

The substrates were then transferred to a vacuum chamber in which, by means of physical vapor deposition, a cathode layer was deposited. In this example, the cathode layer was prepared by the sequential deposition of two metal layers, the first being a 5 nm layer of Ca (0.1 nm/sec) followed by a 200 nm layer of Al (0.5 nrm/sec) with the base pressure at $5 \times 10^{-7}$ Torr.

The devices thus obtained were encapsulated with a glass cover slip to prevent exposure to ambient conditions by means of a UV-light curing epoxy resin cured at 80 W/cm² UV exposure 4 min. The devices thus obtained were tested and the data are given in Table I.

TABLE I

Lifetime Data from different example HIL materials described in this invention:

| HIL System | Current Density (mA/cm2) | Voltage (Volts) | Brightness (cd/m2) | Efficiency (Cd/A) | Lifetime at 50 mA/cm² (hrs) |
|---|---|---|---|---|---|
| PEDOT:PSS#8000 Control | 111 | 6.6 | 762 | 0.69 | 802 |
| Example 1 | 111 | 8.2 | 292 | 0.26 | 1112 |
| Example 2 | 111 | 6.8 | 528 | 0.48 | 288 |
| Example 3 | 100 | 6.6 | 742 | 0.74 | 180* |

| Example[1] | DMF[2] | Dowanol PM Acetate | Plexcore MP[3] | P4VPyr[4] | P4VPhOH[5] | pTSA[6] | DDBSA[7] | DDQ[8] |
|---|---|---|---|---|---|---|---|---|
| 1 | 14.67 | | 0.06 | 0.21 | | 0.057 | | 0.017 |
| 2 | 14.63 | | 0.06 | 0.21 | | | 0.098 | 0.017 |
| 3 | 14.56 | | 0.06 | 0.24 | | | 0.142 | |
| 4 | 14.63 | | 0.06 | | 0.21 | | 0.098 | 0.017 |
| 5 | 13.17 | 1.46 | 0.06 | 0.21 | | | 0.098 | 0.017 |

Dowanol PM Acetate is 1-methoxy-2-propanol acetate.

TABLE I-continued

Lifetime Data from different example HIL materials described in this invention:

| HIL System | Current Density (mA/cm2) | Voltage (Volts) | Brightness (cd/m2) | Efficiency (Cd/A) | Lifetime at 50 mA/cm$^2$ (hrs) |
|---|---|---|---|---|---|
| Example 4 | 100.0 | 4.5 | 1090 | 1.09 | >5000** |
| Example 5 | 100 | 5.6 | 617 | 0.62 | >90** |

*Accelerated lifetime value, 50 mA/cm$^2$ at 70° C.
**Lifetime is extrapolated from initial values and thus an estimation.

A series of preferred, numbered embodiments is provided.

Embodiments

The following represent additional preferred embodiments of the invention which can be practiced by one skilled in the art:

1) An HIL system comprising an ICP, a planarizing agent, a dopant which are soluble in a non-aqueous solvent.
2) Embodiment # 1 in which the ICP is a regioregular poly(3-substituted thiophene) or one of its derivatives.
3) Embodiment # 1 in which the ICP is poly(thiophene) or a poly(thiophene) derivative.
4) Embodiment # 1 in which the ICP is poly(pyrrole) or a poly(pyrrole) derivative.
5) Embodiment # 1 in which the ICP is poly(aniline) or a poly(aniline) derivative. Embodiment # 1 in which the ICP is poly(phenylene vinylene) or a poly(phenylene vinylene derivative).
6) Embodiment # 1 in which the ICP is poly(thienylene vinylene) or a poly(thienylene vinylene) derivative.
7) Embodiment #1 in which the ICP is poly(bis-thienylene vinylene) or a poly(bis-thienylene vinylene) derivative.
8) Embodiment #1 in which the ICP is a poly(acetylene) or a poly(acetylene) derivative.
9) Embodiment #1 in which the ICP is poly(fluorene) or a poly(fluorene) derivative.
10) Embodiment # 1 in which the ICP is a poly(arylene) or a poly(arylene) derivative.
11) Embodiment #1 in which the ICP is poly(isothianaphthalene) or a poly(isothianaphthalene) derivative.
12) Embodiment # 1-11 in which the ICP is a copolymer of an ICP segment and a polymer or oligomer segment composed of polymers built from monomers CH$_2$CH Ar, where Ar=any aryl or functionalized aryl group, isocyanates, ethylene oxides, conjugated dienes.
13) Embodiment # 1-11 in which the ICP is a copolymer of an ICP segment and a polymer or oligomer segment composed of polymers built from monomers CH$_2$CHR$_1$R (where R$_1$=alkyl, aryl, or alkyl/aryl functionality and R=H, alkyl, Cl, Br, F, OH, ester, acid, or ether), lactam, lactone, siloxanes, and ATRP macroinitiators.
14) Embodiments # 12-13 in which the copolymer is a block copolymer or oligomer.
15) Embodiments # 12-13 in which the copolymer is an alternating copolymer or oligomer.
16) Embodiments # 12-13 in which the copolymer is a graft copolymer.
17) Embodiments # 12-13 in which the copolymer is a gradient copolymer.
18) Embodiments # 12-13 in which the copolymer is a random copolymer.
19) Embodiments #1-18 in which the planarizing agent is comprised of a polymer or oligomer.
20) Embodiments # 1-18 in which the planarizing agent is a poly(styrene) or poly(styrene) derivatives.
21) Embodiments # 1-18 in which the planarizing agent is a poly(vinyl acetate) or its derivatives.
22) Embodiment # 21 in which the planarizing agent is a poly(ethylene-co-vinyl acetate).
23) Embodiments #1-18 in which the planarizing agent is a poly(ethylene glycol) or its derivatives.
24) Embodiments #1-18 in which the planarizing agent is poly(pyrrolidone) or its derivatives.
25) Embodiment #24 in which the planarizing agent is poly(1-vinylpyrrolidone-co-vinyl acetate.
26) Embodiments # 1-18 in which the planarizing agent is poly(vinyl pyridine) or its derivatives.
27) Embodiments # 1-18 in which the planarizing agent is poly(methyl methacrylate) or its derivatives.
28) Embodiments # 1-18 in which the planarizing agent is poly(butyl acrylate) or its derivatives.
29) Embodiments # 1-18 in which the planarizing agent is comprised of polymers or oligomers built from monomers such as CH$_2$CHAr, where Ar=any aryl or functionalized aryl group.
30) Embodiments #1-18 in which the planarizing agent is an isocyanates.
31) Embodiments # 1-18 in which the planarizing agent is an ethylene oxides.
32) Embodiments # 1-18 in which the planarizing agent is conjugated dienes.
33) Embodiments #-1-8 in which the planarizing agent is CH$_2$CHR$_1$R (where R$_1$=alkyl, aryl, or alkyl/aryl functionality and R=H, alkyl, Cl, Br, F, OH, ester, acid, or ether).
34) Embodiments #1-18 in which the planarizing agent is a polymer that is derived from a lactam.
35) Embodiments # 1-18 in which the planarizing agent is a polymer that is derived from a lactone.
36) Embodiments #1-18 in which the planarizing agent is a polymer that is derived from a siloxane.
37) Embodiment #1-18 in which the planarizing agent is a small molecule.
38) Embodiments # 1-18 in which the dopant is a molecular halogen.
39) Embodiments #1-18 in which the dopant is iron or gold trichloride.
40) Embodiments #1-18 in which the dopant is arsenic pentafluoride.
41) Embodiments #1-18 in which the dopant is an alkali metal salt of hypochlorite.
42) Embodiments # 1-18 in which the dopant is a protic acid.
43) Embodiments #1-18 in which the dopant is an organic or carboxylic acid.
44) Embodiments # 1-18 in which the dopant is a nitrosonium salt.
45) Embodiments #1-18 in which the dopant is an organic oxidant.
46) Embodiments # 1-18 in which the dopant is a hypervalent iodine oxidant.
47) Embodiments # 1-18 in which the dopant is a polymeric oxidant.
48) Embodiments # 1-47 in which the planarizing is complexed with the dopant.
49) Embodiments # 1-48 in which the planarizing agent and ICP are joined as a copolymer.

50) Embodiments #1-49 in which the HIL system contains a cross-linking agent for the planarizing agent.
51) Embodiments #1-50 in which the HIL system contains a cross-linking agent for the ICP.
52) HIL films cast from Embodiments #1-51.
53) Embodiment #52 in which the film is prepared by spin casting.
54) Embodiment #52 in which the film is prepared by drop casting.
55) Embodiment #52 in which the film is prepared by dip-coating.
56) Embodiment #52 in which the film is prepared by spray-coating.
57) Embodiment #52 in which the film is prepared by a printing method.
58) Embodiment #57 in which the printing method is ink jet printing.
59) Embodiment #57 in which the printing method is off-set printing.
60) Embodiment #57 in which the printing method is a transfer process.
61) Devices incorporating Embodiments #52-60.
62) Methods for forming Embodiments #1-61.
63) Use of Embodiment #61.

The following 33 embodiments were described in priority provisional application 60/651,211 filed Feb. 10, 2005:

Embodiment 1. A blend composition for use in a hole injection layer or hole transport layer comprising the following components:
  (i) at least one intrinsically conductive polymer or copolymer;
  (ii) at least one dopant for the conductive polymer or copolymer; and
  (iii) at least one planarizing agent;

wherein the components are soluble in non-aqueous solvents and are formulated to form a compatible blend when the composition is in the form of a hole injection layer or hole transport layer less than about 100 nm thick.

Embodiment 2. The composition according to Embodiment 1, wherein the intrinsically conductive polymer is a polythiophene.

Embodiment 3. The composition according to Embodiment 1, wherein the intrinsically conductive polymer is a regioregular 3-substituted polythiophene.

Embodiment 4. The composition according to Embodiment 1, wherein the intrinsically conductive polymer is a regioregular alkyl/alkoxy-, etheric, poly(etheric), or aryl-substituted polythiophene block copolymer comprising a polythiophene block and a non-polythiophene block.

Embodiment 5. The composition according to Embodiment 1, wherein the planarizing agent is a synthetic polymer.

Embodiment 6. The composition according to Embodiment 1, wherein the composition is in the form of a film about 2 nm to about 100 nm thick.

Embodiment 7. The composition according to Embodiment 1, wherein the amounts of the intrinsically conductive polymer or copolymer, the planarizing agent, and the dopant is about 0.5 wt % to about 25 wt %, about 0.5 wt % to about 70 wt %, and about 0.5 wt % to about 5 wt %, respectively.

Embodiment 8. The composition according to Embodiment 1, wherein the amounts of the intrinsically conductive polymer or copolymer, the planarizing agent, and the dopant, is about 25 wt %, about 70 wt %, and about 5 wt %, respectively.

Embodiment 9. The composition according to Embodiment 1, wherein the composition further comprises non-aqueous solvent, and wherein the intrinsically conductive polymer is a regioregular alkyl/alkoxy-, etheric, poly(etheric), or aryl-substituted polythiophene, the planarizing agent is a synthetic polymer, wherein the constituents are present in amounts of about 1.5 wt % to about 5 wt % as the total solid content in non-aqueous solvent.

Embodiment 10. The composition according to Embodiment 1, wherein the intrinsically conductive polymer is a regioregular alkyl/alkoxy-, etheric, poly(etheric), or aryl-substituted polythiophene block copolymer comprising a polythiophene block and a non-polythiophene block, and the non-polythiophene block is substantially similar to the planarizing agent.

Embodiment 11. The composition according to Embodiment 1, wherein the dopant is present as an ambient dopant.

Embodiment 12. An electroluminescent (EL) device comprising an anode, a cathode, and a hole injection layer or a hole transport layer, wherein the hole injection layer or hole transport layer comprises a blend composition for use in a hole injection layer or hole transport layer comprising at least one of the following components:
  (i) at least one intrinsically conductive polymer or copolymer;
  (ii) at least one dopant for the conductive polymer or copolymer, and
  (iii) at least one planarizing agent wherein the components are soluble in non-aqueous solvents and are formulated to form a compatible blend when the composition is in the form of the hole injection layer or hole injection layer about 2 nm to about 100 nm thick.

Embodiment 13. The EL device according to Embodiment 12, wherein the device further comprises a conditioning layer.

Embodiment 14. The EL device according to Embodiment 12, wherein the intrinsically conductive polymer or copolymer is a polythiophene.

Embodiment 15. The EL device according to Embodiment 12, wherein the intrinsically conductive polymer or copolymer is a regioregular substituted polythiophene.

Embodiment 16. The EL device according to Embodiment 12, wherein the intrinsically conductive polymer is a regioregular alkyl/alkoxy-, etheric, poly(etheric), or aryl-substituted polythiophene block copolymer comprising a polythiophene block and a non-polythiophene block.

Embodiment 17. The EL device according to Embodiment 12, wherein the planarizing agent is a synthetic polymer.

Embodiment 18. A method for making a composition for use in a hole injection layer comprising at least one of the following components which comprises combining:
  (i) at least one intrinsically conductive polymer or copolymer,
  (ii) at least one dopant for the conductive polymer or copolymer, and
  (iii) at least one planarizing agent, wherein the components (i), (ii), and (iii) are soluble in non-aqueous solvents.

Embodiment 19. A composition for use in a hole injection layer or a hole transport layer comprising at least one of the following components:
  (i) at least one intrinsically conductive polymer, wherein the intrinsically conductive polymer is covalently bonded to a planarizing agent, and
  (ii) at least one dopant for the conductive polymer;

wherein the components are soluble in non-aqueous solvents and the composition is in the form of a hole injection layer about 2 nm to about 100 nm thick.

Embodiment 20. A blend composition for use in a hole injection layer or hole transport layer without substantial presence of water consisting essentially of the following components:
(i) at least one intrinsically conductive polymer or copolymer;
(ii) at least one dopant for the conductive polymer or copolymer, and
(iii) at least one planarizing agent;

wherein the components are soluble in non-aqueous solvents and are formulated without substantial use of water to form a compatible blend when the composition is in the form of a hole injection layer or hole transport layer less than about ~100 nm thick.

Embodiment 21. An electroluminescent device comprising as a hole injection layer or a hole transport layer a blend composition comprising the following components:
(i) at least one intrinsically conductive polymer or copolymer;
(ii) at least one dopant for the conductive polymer or copolymer, and
(iii) a matrix component to form a blend with the polymer or copolymer and the dopant;

wherein the components are soluble in non-aqueous solvents.

Embodiment 22. A composition for use as a hole injection layer or a hole transport layer in an electroluminescent device comprising the following components:
(i) at least one intrinsically conductive polymer or copolymer;
(ii) at least one dopant for the conductive polymer or copolymer, and
(iii) a matrix component to form a blend with the polymer or copolymer and the dopant;

wherein the components are soluble in non-aqueous solvents.

Embodiment 23. The composition according to Embodiment 22, wherein the intrinsically conductive polymer or copolymer is a polythiophene.

Embodiment 24. The composition according to Embodiment 22, wherein the intrinsically conductive polymer or copolymer is a regioregular 3-substituted polythiophene.

Embodiment 25. The composition according to Embodiment 22, wherein the intrinsically conductive polymer is a regioregular alkyl/alkoxy-, etheric, poly(etheric), or aryl-substituted polythiophene block copolymer comprising a polythiophene block and a non-polythiophene block.

Embodiment 26. The composition according to Embodiment 22, wherein the matrix component is a synthetic polymer.

Embodiment 27. The composition according to Embodiment 22, wherein the composition is in the form of a film about 2 nm to about 100 nm thick.

Embodiment 28. The composition according to Embodiment 22, wherein the amounts of the intrinsically conductive polymer or copolymer, the matrix component, and the dopant is about 0.5 wt % to about 25 wt %, about 0.5 wt % to about 70 wt %, and about 0.5 wt % to about 5 wt %, respectively.

Embodiment 29. The composition according to Embodiment 22, wherein the amounts of the intrinsically conductive polymer or copolymer, the matrix component, and the dopant, is about 25 wt %, about 70 wt %, about 5 wt %, respectively.

Embodiment 30. The composition according to Embodiment 22, wherein the composition further comprises non-aqueous solvent, and wherein the intrinsically conductive polymer is a regioregular alkyl/alkoxy-, etheric, poly (etheric), or aryl-substituted polythiophene, the matrix is a synthetic polymer, wherein the constituents are present in amounts of about 1.5 wt % to about 5 wt % as the total solid content in non-aqueous solvent.

Embodiment 31. The composition according to Embodiment 22, wherein the intrinsically conductive polymer is a regioregular alkyl/alkoxy-, etheric, poly(etheric), or aryl-substituted polythiophene block copolymer comprising a polythiophene block and a non-polythiophene block, and the non-polythiophene block is substantially similar to the matrix component.

Embodiment 32. The composition according to Embodiment 22, wherein the dopant is present as an ambient dopant.

Embodiment 33. An electroluminescent device comprising a hole injection layer or a hole transport layer comprising any of the compositions according to Embodiments 22-32.

The following endnote references 1-16 are cited hereinabove.

[1] (a) Burroughes, J. H.; Bradley, D. D. C.; Brown, A. R.; Marks, R. N.; MacCay, K.; Friend, R. H.; Burn, P. L.; Holmes, A. B. *Nature* 1990, 347, 539. (b) Friend, R. H.; Bradley, D. D. C.; Holmes, A. B. *Physics World* 1992, 5, 42.

[2] Shuai, Z.; Beljonne, D.; Silbey, R. J.; Bredas, J. L. *Phys. Rev. Lett.* 2000, 84, 131.

[3] Shinar, J. *Organic Light-Emitting Devices*, Springer-Verlag New-York, Inc. 2004.

[4] Kim, J.-S.; Ho, P. K. H.; Greenham, N. C.; Friend, R. H. *J. Appl. Phys.* 2000, 88, 1073.

[5] Gontia, I.; Frolov, S. V.; Liess, M.; Ehrenfreund, E.; Vardeny, Z. V.; Tada, K.; Kajii, H.; Hidayat, R.; Fujii, A.; Yoshino, K.; Teraguchi, M.; Masuda, T. *Phys. Rev. Lett.* 1999, 82, 4058.

[6] Kraft, A.; Grimsdale, A. C.; Holmes, A. B. *Angew. Chem. Int. Ed.* 1998, 37, 402.

[7] de Kok, M. M.; Buechel, M.; Vulto, S. I. E.; van de Weijer, P.; Meulenkamp, E. A.; de Winter, S. H. P. M.; Mank, A. J. G.; Vorstenbosch, H. J. M.; Weijtens, C. H. L.; van Elsbergen, V. *Phys. Stat. Sol.* 2004, 201, 1342.

[8] Chen, S.; Wang, C. *Appl. Phys. Lett.* 2004, 85, 765.

[9] Shirota, Y. K., Y.; Inada, H.; Wakimoto, T.; Nakada, H.; Yonemoto, Y.; Kawami, S.; Imai, K. *Appl. Phys. Lett.* 1994, 65, 807.

[10] Book, K. B.; Elschener, A.; Kirchmeyer, S. *Organic Electronics* 2003, 4, 227.

[11] Kugler, T.; Salaneck, W. R.; Rost, H.; Holmes, A. B. *Chem. Phys. Lett.* 1999, 310, 391.

[12] (a) de Jong, M. P.; de Voigt, M. J. A.; *Appl. Phys. Lett.* 2000, 77, 2255. (b) Esselink, F. J.; Hadziioannou, G. *Synth. Met.* 1995, 75, 209. (c) Schlatmann, A. R.; Floet, D. W.; Hilberer, A.; Garten, F.; Smulders, P. J. M.; Klapwijk, T. M.; Hadziioannou, G. *Appl. Phys. Lett.* 1996, 69, 1764.

[13] Redecker, M. B.; Inbasekaran, M.; Wu, W. W.; Woo, E. P. *Adv. Mater.* 1999, 11, 241.

[14] Gong, X. M. D.; Moses, D.; Heeger, A. J.; Liu, S.; Jen, K. *Appl. Phys. Lett.* 2003, 83, 183.

[15] Lowe, R. S.; Khersonsky, S. M.; McCullough, R. D. *Adv. Mater.* 1999, 11, 250.

[16] (a) Sheina, E. E.; Liu, J.; Iovu, M. C.; Laird, D. W.; McCullough, R. D. *Macromolecules* 2004, 37, 3526. (b) Yokoyama, A.; Miyakoshi, R.; Yokozawa, T. *Macromolecules* 2004, 37, 1169.

What is claimed is:

1. A blend composition for use in a hole injection layer or hole transport layer comprising the following components:
(i) at least one intrinsically conductive polymer or copolymer, (ii) at least one dopant for the conductive polymer or copolymer; and (iii) at least one planarizing agent, wherein the planarizing agent is a synthetic polymer;

wherein the components are soluble in non-aqueous solvents and are formulated to form a compatible blend when the composition is in the form of a hole injection layer or hole transport layer less than about 200 nm thick, wherein the intrinsically conductive polymer or copolymer is a regioregular 3-substituted polythiophene.

2. The composition according to claim 1, wherein the intrinsically conductive polymer or copolymer is a homopolymer.

3. The composition according to claim 1, wherein the intrinsically conductive polymer or copolymer is a copolymer.

4. The composition according to claim 1, wherein the intrinsically conductive polymer or copolymer is a block copolymer.

5. The composition according to claim 1, wherein the intrinsically conductive polymer or copolymer is a regioregular alkyl/alkoxy-, etheric, poly(etheric), or aryl-substituted polythiophene block copolymer comprising a polythiophene block and a non-polythiophene block.

6. The composition according to claim 1, wherein the intrinsically conductive polymer or copolymer is a regioregular alkyl/alkoxy-, etheric, poly(etheric), or aryl-substituted polythiophene block copolymer comprising a polythiophene block and a non-polythiophene block, and the non-polythiophene block is substantially similar to the planarizing agent.

7. The blend composition according to claim 1, wherein the layer is less than about 100 nm thick.

8. The composition according to claim 1, wherein the composition is in the form of a film about 2 nm to about 100 nm thick.

9. The composition according to claim 1, wherein the amounts of the intrinsically conductive polymer or copolymer, and the planarizing agent are about 0.5 wt % to about 25 wt %, and about 0.5 wt % to about 70 wt %, respectively.

10. The composition according to claim 1, wherein the amounts of the intrinsically conductive polymer or copolymer, and the planarizing agent are about 0.5 wt % to about 25 wt %, and about 0.5 wt % to about 80 wt %, respectively.

11. The composition according to claim 1, wherein the planarizing agent is an organic polymer.

12. The composition according to claim 1, wherein the dopant comprises organic oxidant.

13. The composition according to claim 1, wherein the dopant is an acid dopant.

14. The composition according to claim 1, wherein the dopant comprises organic oxidant, the planarizing agent is an organic polymer, the polymer or copolymer comprises regioregular polythiophene, and the amounts of the intrinsically conductive polymer or copolymer, and the planarizing agent are about 0.5 wt % to about 25 wt %, and about 0.5 wt % to about 70 wt %, respectively.

15. The composition according to claim 1, wherein the dopant comprises organic oxidant, the planarizing agent is an organic polymer, and the amounts of the intrinsically conductive polymer or copolymer, and the planarizing agent are about 0.5 wt % to about 25 wt %, and about 0.5 wt % to about 80 wt %, respectively.

16. An electroluminescent (EL) device comprising an anode, a cathode, and a hole injection layer or a hole transport layer, wherein the hole injection layer or hole transport layer comprises a blend composition according to claim 1.

17. A method comprising the step of ink jet printing the composition according to claim 1, wherein the composition further comprises organic solvent.

18. An electroluminescent device comprising a hole injection layer or hole transport layer comprising the following components:

(i) at least one intrinsically conductive polymer or copolymer soluble in non-aqueous solvent, and wherein the intrinsically conductive polymer or copolymer is a regioregular 3-substituted polythiophene, (ii) at least one dopant for the conductive polymer or copolymer; and (iii) at least one planarizing agent, wherein the planarizing agent is a synthetic polymer soluble in non-aqueous solvent;

wherein the hole injection layer or hole transport layer is less than about 200 nm thick.

19. The device according to claim 18, wherein conductive polymer or copolymer is a homopolymer.

20. The device according to claim 18, wherein conductive polymer or copolymer is a copolymer.

21. The device according claim 18, wherein the intrinsically conductive polymer or copolymer is a regioregular alkyl/alkoxy-, etheric, poly(etheric), or aryl-substituted polythiophene block copolymer comprising a polythiophene block and a non-polythiophene block.

22. The device according to claim 18, wherein the intrinsically conductive polymer or copolymer is a regioregular alkyl/alkoxy-, etheric, poly(etheric), or aryl-substituted polythiophene block copolymer comprising a polythiophene block and a non-polythiophene block, and the non-polythiophene block is substantially similar to the planarizing agent.

23. The device according to claim 18, wherein the hole injection layer or hole transport layer is about 2 nm to about 100 m thick.

24. The device according to claim 18, wherein the amounts of the intrinsically conductive polymer or copolymer, and the planarizing agent are about 0.5 wt % to about 25 wt %, and about 0.5 wt % to about 80 wt %, respectively.

25. The device according to claim 18, wherein the planarizing agent is an organic polymer.

26. The device according to claim 18, wherein the dopant comprises organic oxidant.

27. The device according to claim 18, wherein the dopant is an acid dopant.

28. The device according to claim 18, wherein the dopant comprises organic oxidant, the planarizing agent is an organic polymer, the polymer or copolymer comprises regioregular polythiophene, and the amounts of the intrinsically conductive polymer or copolymer, and the planarizing agent are about 0.5 wt % to about 25 wt %, and about 0.5 wt % to about 70 wt %, respectively.

29. The device according to claim 18, wherein the dopant comprises organic oxidant, the planarizing agent is an organic polymer, and the amounts of the intrinsically conductive polymer or copolymer, and the planarizing agent are about 0.5 wt % to about 25 wt %, and about 0.5 wt % to about 80 wt %, respectively.

30. An electroluminescent device comprising a hole injection layer or hole transport layer comprising the following components:

(i) at least one intrinsically conductive polymer or copolymer, wherein the intrinsically conductive polymer or copolymer is a regioregular 3-substituted polythiophene soluble in non-aqueous solvent;

(ii) at least one dopant for the conductive polymer or copolymer; and (iii) at least one synthetic polymer soluble in non-aqueous solvent; wherein the hole injection layer or hole transport layer is less than about 200 nm thick.

31. The device according to claim 30, wherein the dopant is an organic dopant.

32. An ink formulation for hole injection layer or hole transport layer application comprising:

about 0.5 wt. % to about 25 wt. % soluble regioregular 3substituted polythiophene soluble in organic solvent, about 0.5 wt. % to about 70 wt. % organic polymer soluble in organic solvent, organic oxidant dopant, and organic solvent.

33. An ink formulation for hole injection layer or hole transport layer application comprising:

about 0.5 wt. % to about 25 wt. % soluble regioregular 3substituted polythiophene soluble in organic solvent, about 0.5 wt. % to about 80 wt. % organic polymer soluble in organic solvent, organic oxidant dopant, and organic solvent.

* * * * *

UNITED STATES PATENT AND TRADEMARK OFFICE
CERTIFICATE OF CORRECTION

| | | |
|---|---|---|
| PATENT NO. | : 7,569,159 B2 | Page 1 of 1 |
| APPLICATION NO. | : 11/350271 | |
| DATED | : August 4, 2009 | |
| INVENTOR(S) | : Hammond et al. | |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 340 days.

Delete the phrase "by 340 days" and insert -- by 516 days --

Signed and Sealed this

Thirtieth Day of March, 2010

David J. Kappos
*Director of the United States Patent and Trademark Office*